United States Patent
Ikuta et al.

(10) Patent No.: US 6,307,496 B1
(45) Date of Patent: Oct. 23, 2001

(54) SENSING APPARATUS INCLUDING AN A/D CONVERSION CIRCUIT FOR DETECTING A PHYSICAL QUANTITY

(75) Inventors: Toshio Ikuta, Handa; Noboru Endo, Anjo; Takamoto Watanabe, Nagoya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/411,319

(22) Filed: Oct. 4, 1999

(51) Int. Cl.[7] ................................... H03M 1/12
(52) U.S. Cl. ................. 341/155; 702/6; 702/130
(58) Field of Search .................. 341/155, 157, 341/166, 118, 119; 702/130

(56) References Cited

U.S. PATENT DOCUMENTS

| | | | |
|---|---|---|---|
| Re. 31,222 | * 4/1983 | McCracken | 702/6 |
| 4,364,028 | * 12/1982 | Masuda et al. | 341/118 |
| 4,475,501 | * 10/1984 | Kato et al. | 123/325 |
| 4,480,312 | * 10/1984 | Wingate | 702/130 |
| 4,738,333 | * 4/1988 | Ollier et al. | 180/272 |
| 4,902,986 | * 2/1990 | Lesmeister | 331/25 |
| 4,908,623 | * 3/1990 | Ullestad | 341/118 |
| 5,349,311 | * 9/1994 | Mentzer | 331/57 |
| 5,396,247 | 3/1995 | Watanabe et al. | 341/157 |
| 5,488,368 | * 1/1996 | Brown et al. | 341/118 |
| 5,708,190 | * 1/1998 | Seefeldt et al. | 73/23.2 |

FOREIGN PATENT DOCUMENTS

| | | |
|---|---|---|
| 0660120-A1 | * 6/1995 | (EP) . |
| 5-259907 | * 10/1993 | (JP) . |
| 9-113310 | 5/1997 | (JP) . |
| 10-281912 | 10/1998 | (JP) . |

* cited by examiner

Primary Examiner—Peguy JeanPierre
Assistant Examiner—Jean Bruner JeanGlaude
(74) Attorney, Agent, or Firm—Pillsbury Winthrop LLP

(57) ABSTRACT

An analog multiplexer is provided to time divisionally process a reference signal Sa obtained from a reference voltage generating circuit, a temperature signal St obtained from a temperature detecting bridge circuit, and a sensor signal Sd obtained from a pressure detecting bridge circuit. These signals Sa, St and Sd are converted into digital data through a common differential amplification circuit and a common A/D conversion circuit. A correction circuit calculates an applied pressure value based on the digital data produced from the A/D conversion circuit, as a value corrected with reference to the temperature signal St and the reference signal Sa.

19 Claims, 9 Drawing Sheets

SENSING APPARATUS INCLUDING AN A/D CONVERSION CIRCUIT FOR DETECTING A PHYSICAL QUANTITY

BACKGROUND OF THE INVENTION

The present invention relates to a sensing apparatus including an A/D conversion circuit for converting an analog sensing signal detected by a sensing circuit into digital data and a signal processing circuit for processing the digital data.

The Unexamined Patent Application No. 9-113310 or No. 10-281912 discloses a sensing apparatus comprising a selector for selectively outputting a pressure signal (i.e., sensor signal), a temperature signal, and a reference signal. Furthermore, the sensing apparatus comprises two oscillation circuits for detecting a time difference between two signals for A/D conversion based on the time A/D processing. In this case, the A/D conversion time is determined in accordance with a signal to be A/D converted, while a constant power source voltage is applied to the A/D conversion circuit.

However, according to such a conventional sensing apparatus, the circuit scale is enlarged due to provision of two oscillation circuits which are associated with capacitors and dividers.

SUMMARY OF THE INVENTION

An object of the present invention is to provide a sensing apparatus which is capable of converting an analog sensor signal into digital data without using the oscillation circuits.

In order to accomplish this and other related objects, the present invention provides a first sensing apparatus comprising a sensing circuit for generating a sensor signal having a voltage level responsive to a detected physical quantity, a temperature detecting circuit for generating a temperature signal having a voltage level responsive to a temperature of the sensing circuit, and a reference voltage generating circuit for generating a reference signal having a constant voltage level irrespective of the detected physical quantity and the temperature of the sensing circuit. An analog multiplexer is provided for selectively outputting the sensor signal, the temperature signal, and the reference signal. An amplification means is provided for amplifying a signal successively produced from the analog multiplexer. An A/D conversion circuit receives an amplified signal produced from the amplification means as a power source voltage and converts the amplification signal into digital data as an A/D conversion value during a predetermined time. And, a signal processing means is provided for performing calculations based on the obtained digital data in such a manner that the physical quantity corresponding to the sensor signal is corrected with reference to the temperature signal and the reference signal.

Namely, the first sensing apparatus uses the analog multiplexer for time division processing the sensor signal, the temperature signal, and the reference signal. The digital data corresponding to respective signals are obtained through the common amplification means and the common A/D conversion means, so that the temperature compensation is performed with respect to the sensitivity. The correcting calculation (digital calculation) is performed based on the digital data thus obtained, thereby enabling a reliable physical quantity detection.

The A/D conversion receives the amplified signal produced from the amplification means as a power source voltage and converts the amplified signal into digital data as an A/D conversion value during a predetermined time interval. With this arrangement, the A/D conversion is feasible based on only one signal supplied from the amplification means. There is no necessity of using two oscillation circuits.

According to the first sensing apparatus, it is not necessary to provide numerous operational amplifiers and amplification circuits. The overall size of the circuit can be reduced.

As the common analog circuit (i.e., the analog multiplexer, the amplification means, the A/D conversion circuit) is used to process the sensor signal, the temperature signal, and the reference signal, it becomes possible to cancel the drift components of respective signals derived from the variation of circuit constants in the signal transmitting path. In other words, it becomes possible to eliminate adverse effect of the aging deterioration. The sensing accuracy can be maintained adequately for a long time.

Preferably, the A/D converting circuit includes a ring-gate delay circuit comprising a plurality of inverting circuits connected in a ring pattern and having an inverting operation time varying in accordance with the power source voltage. Each of the sensor signal, the temperature signal, and the reference signal, when serving as the power source voltage of the ring-gate delay circuit, is converted into digital data based on a pulse signal circulation frequency when a pulse signal is entered into the ring-gate delay circuit.

Preferably, the physical quantity to be detected by the sensing circuit is pressure. In this case, the signal processing means is for calculating a pressure P applied to the sensing circuit according to the following equation $$P = \{(T/A-b) \times (-e/a) + D/A - f\} / \{(T/A-b) \times c/a + d\}$$

where D, T and A are digital data respectively representing pressure information, temperature information, and reference information converted by the A/D converting circuit, "c" represents a temperature coefficient in the sensitivity of the sensing circuit, "d" represents a room temperature sensitivity of the sensing circuit, "e" represents a temperature coefficient of an offset of a detected pressure value, "f" represents a room temperature offset value of the detected pressure value, "a" represents a temperature coefficient of a detected temperature value, and "b" represents a room temperature offset value of the detected temperature value.

It is preferable that the first sensing apparatus further comprises a power source circuit which is operative to supply a constant voltage to the sensing circuit, the temperature detecting circuit, the reference voltage generating circuit, the analog multiplexer, and the amplification means. And, a control means is provided for stopping an operation of the power source circuit when the A/D converting circuit has completed the operation for converting the sensor signal, the temperature signal, and the reference signal into digital data.

It is also preferable that the first sensing apparatus further comprises a constant voltage power source for maintaining the amplified signal of the amplification means at a predetermined voltage level.

Furthermore, the present invention provides a second sensing apparatus comprising a sensing circuit for generating a sensor signal having a voltage level responsive to a detected physical quantity, a temperature detecting circuit for generating a temperature signal having a voltage level responsive to a temperature of the sensing circuit, and a reference voltage generating circuit for generating a reference signal having a constant voltage level irrespective of the detected physical quantity and the temperature of the sensing circuit. The A/D conversion circuit of the second sensing apparatus includes a ring-gate delay circuit comprising a plurality of inverting circuits connected in a ring pattern and having an inverting operation time varying in accordance with the power source voltage, for converting each of the sensor signal, the temperature signal, and the reference signal, when serving as a power source voltage of the ring-gate delay circuit, into binary data based on a pulse signal circulation frequency when a pulse signal is entered into the ring-gate delay circuit. A signal processing means is provided for performing calculations based on the digital data in such a manner that the physical quantity corresponding to the sensor signal is corrected with reference to the temperature signal and the reference signal. And, a compensating means is provided for compensating the power source voltage applied to the ring-gate delay circuit in the A/D conversion circuit.

The second sensing apparatus is characterized in that the compensating means includes memory means for storing correction voltage data corresponding to offset amounts of the sensor signal, the temperature signal, and the reference signal under same conditions. The power source voltage applied to the ring-gate delay circuit is corrected in accordance with the correction data when the sensor signal, the temperature signal, and the reference signal are selectively applied to the A/D conversion circuit as the power source voltage.

With the arrangement of the second sensing apparatus, it becomes possible to surely remove the nonlinear components from the conversion data even if any offset is caused due to dispersion in the electric characteristics of the sensing circuit, the temperature detecting circuit, and the reference voltage generating circuit.

It is preferable that the second sensing apparatus further comprises amplification means for amplifying the sensor signal, the temperature signal, and the reference signal and applies an amplified signal to the ring-gate delay circuit in the A/D conversion circuit. In this case, an amplification rate of the amplification means is determined in such a manner that the amplified signal of the amplification means contains a nonlinear error component equal to or less than 0.1%. Or, an amplification rate of the amplification means is determined in such a manner that a difference between a maximum voltage level and a minimum voltage level of the amplified signal of the amplification means is equal to or less than 150 mV. The second sensing apparatus may further comprises an analog multiplexer for selectively outputting the sensor signal, the temperature signal, and the reference signal. And, the amplification means is for amplifying an output signal selected by the analog multiplexer and applying the amplified signal as the power source voltage to the ring-gate delay circuit in the A/D conversion circuit.

Preferably, the A/D conversion circuit has a sampling period equal to or larger than 50 $\mu$sec.

Preferably, the memory means stores the correction voltage data in a quantized condition. The compensating means further comprises a selector for selectively outputting the correction voltage data from the memory means and a D/A conversion circuit for converting the selected correction voltage data into an analog voltage signal.

Preferably, the physical quantity to be detected by the sensing circuit is pressure. In this case, the sensing circuit includes a plurality of diffused resistance elements formed on a diaphragm of a semiconductor chip and arranged in a bridge connection pattern, and the temperature detecting circuit includes at least one temperature-sensitive diffused resistance element formed on the semiconductor chip. The signal processing means is for calculating a pressure P applied to the sensing circuit according to the equation $P=\{(T/A-b)\times(-e/a)+D/A-f\}/\{(T/A-b)\times c/a+d\}$.

Moreover, the present invention provides a third sensing apparatus comprising a pressure sensing circuit for generating a sensor signal having a voltage level responsive to a detected pressure, a temperature detecting circuit for generating a temperature signal having a voltage level responsive to a temperature of the pressure sensing circuit, and a reference voltage generating circuit for generating a reference signal having a constant voltage level irrespective of the detected pressure and the temperature of the pressure sensing circuit. An analog multiplexer is provided for selectively outputting the sensor signal, the temperature signal, and the reference signal. An A/D conversion circuit is provided for converting the sensor signal, the temperature signal, and the reference signal into digital data. And, a signal processing means is provided for calculating a pressure P applied to the pressure sensing circuit according to the equation $P=\{(T/A-b)\times(-e/a)+D/A-f\}/\{(T/A-b)\times c/a+d\}$.

The analog multiplexer of the third sensing apparatus is characterized in that the reference signal and the temperature signal are outputted prior to the sensor signal. The signal processing means of the third sensing apparatus is characterized in that calculation steps relating to the reference information A and the temperature information T corresponding to the reference signal and the temperature signal are performed in advance and another calculation steps relating to the pressure information D corresponding to the sensor signal is performed at a later timing.

With the arrangement of the third sensing apparatus, it becomes possible to partly finish the calculation for obtaining the detected pressure value in advance. Namely, the third sensing apparatus performs the calculations not relating to the pressure information D during the sampling interval for obtaining the pressure information D. Thus, the overall time required for completing the pressure calculation cycle can be shortened.

Preferably, the analog multiplexer of the third sensing apparatus successively outputs the reference signal, the temperature signal, and the sensor signal in this order. The signal processing means is for successively performing first, second, and third calculation steps in this order, wherein the first calculation step is for performing the calculation based on the reference information A, the second calculation step is for performing the calculation based on the temperature information T and the calculation result of the first calculation step, and the third calculation step is for performing the calculation based on the pressure information D and the calculation result of the second calculation step.

Preferably, the A/D converting circuit includes a ring-gate delay circuit comprising a plurality of inverting circuits connected in a ring pattern and having an inverting operation time varying in accordance with a power source voltage. Each of the sensor signal, the temperature signal, and the reference signal, when serving as the power source voltage of the ring-gate delay circuit, is converted into digital data based on a pulse signal circulation frequency when a pulse signal is entered into the ring-gate delay circuit.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1:
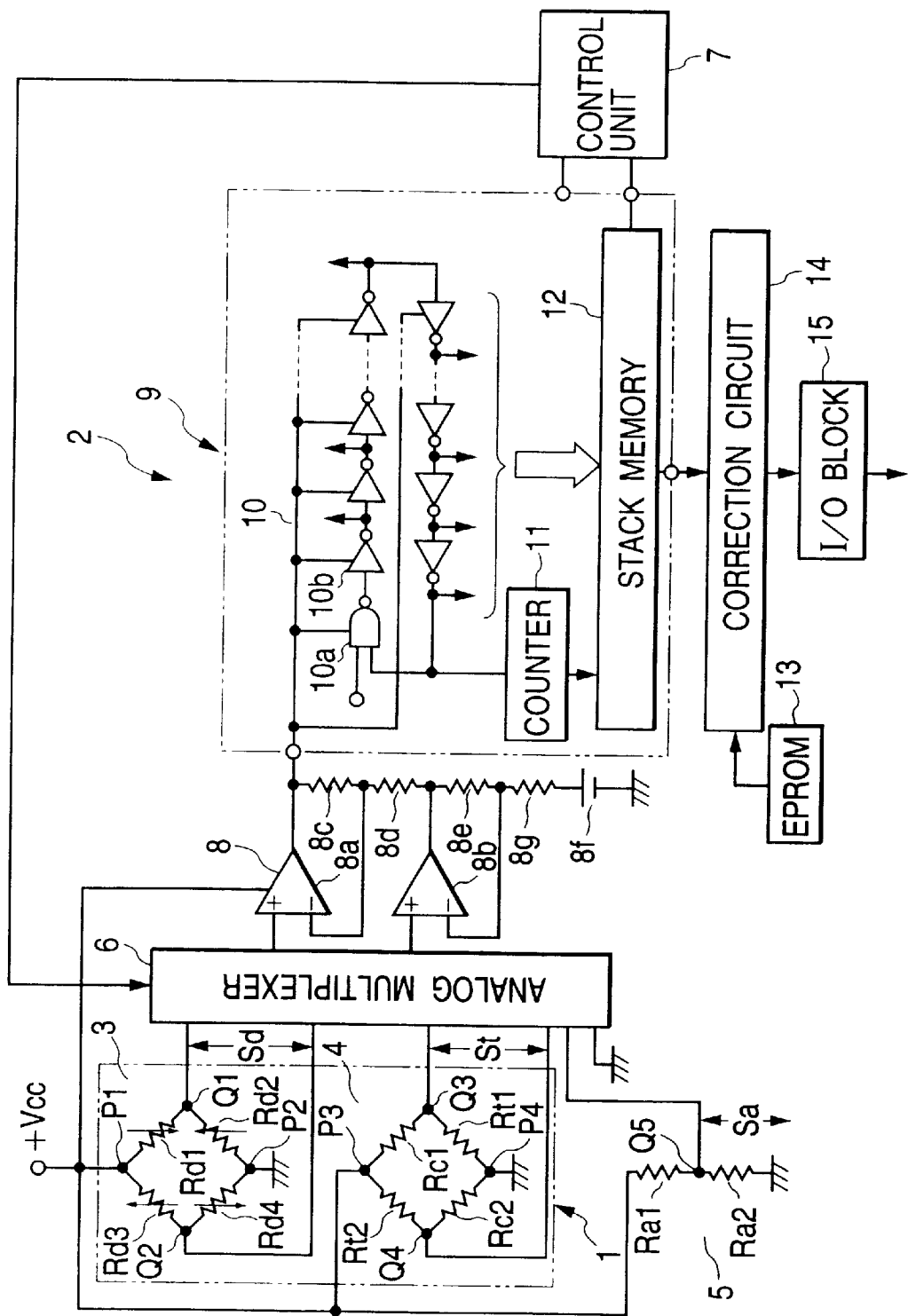
FIG. 1 is a circuit diagram showing an overall arrangement of a semiconductor pressure sensing apparatus in accordance with a first embodiment of the present invention.

Preferred embodiments of the present invention will be explained hereinafter with reference to attached drawings. Identical parts are denoted by the same reference numerals throughout the views.

First Embodiment

Figure 2:
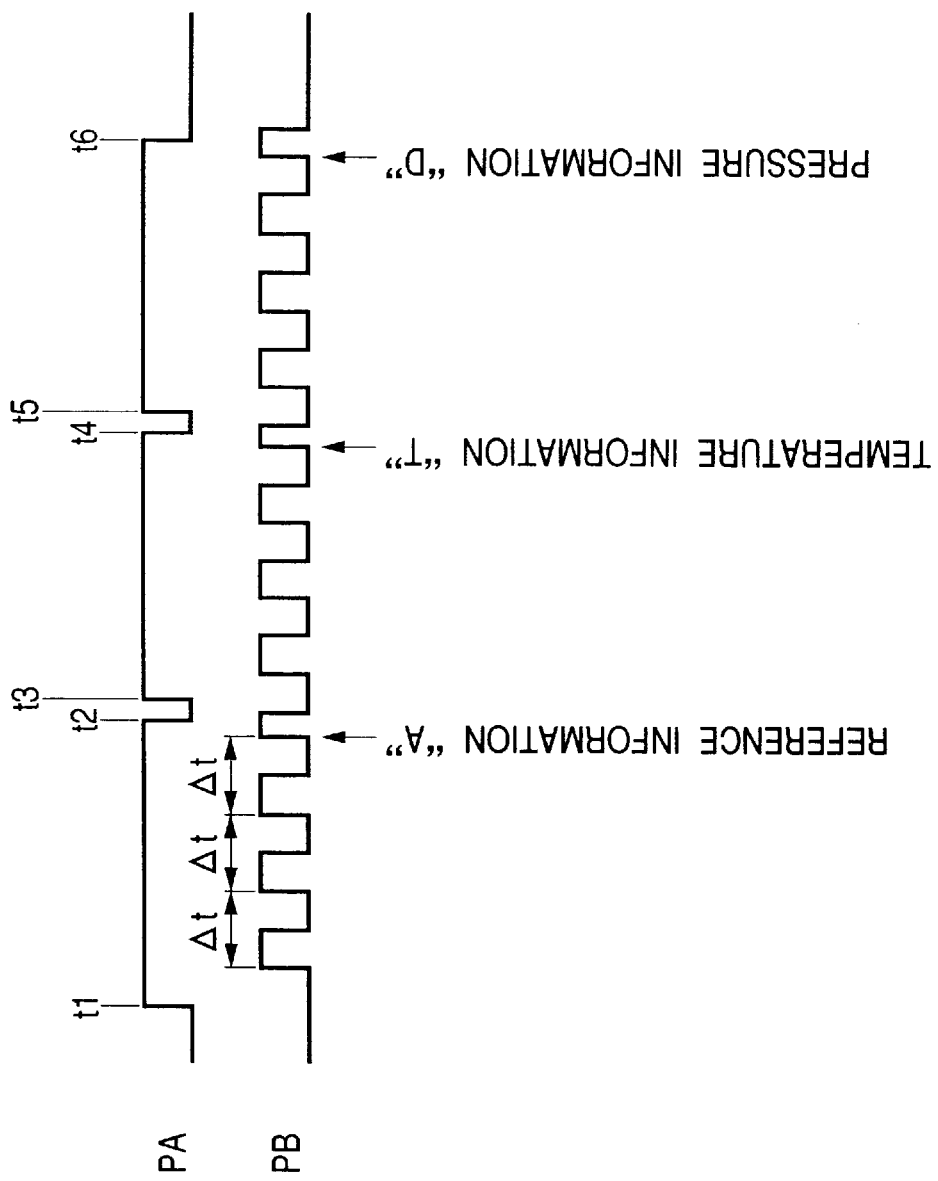
FIG. 2 is a timing chart showing the operation of the semiconductor pressure sensing apparatus in accordance with the first embodiment of the present invention.
Figure 3:
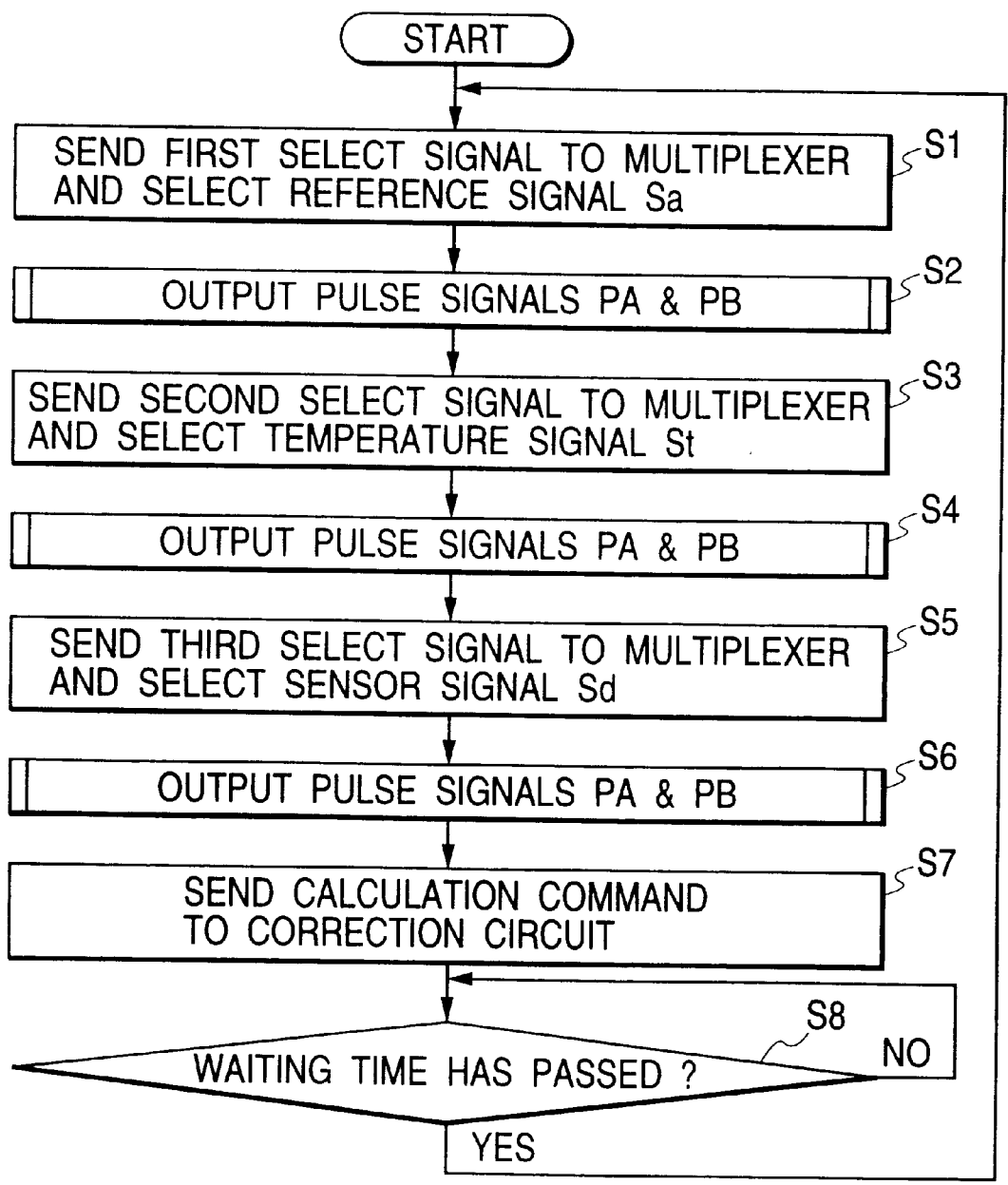
FIG. 3 is a flowchart showing a control procedure performed in a control unit of the semiconductor pressure sensing apparatus in accordance with the first embodiment of the present invention.

FIGS. 1 to 3 cooperatively show a semiconductor pressure sensing apparatus in accordance with a first embodiment of the present invention.

As shown in an overall circuit arrangement shown in FIG. 1, the semiconductor pressure sensing apparatus comprises a sensing section 1 which detects the pressure and a signal processing section 2 which processes the output of the sensing portion 1. The sensing section 1 and the signal processing section 2 are formed separately on different semiconductor chips.

The sensing section 1 is made of a semiconductor chip (e.g., silicon monocrystal) having a large piezoelectric-resistance coefficient. The sensing section 1 comprises a pressure detecting bridge circuit 3 and a temperature detecting bridge circuit 4. The pressure detecting bridge circuit 3 detects a pressure applied to this circuit. The temperature detecting bridge circuit 4 detects the temperature of the pressure detecting bridge circuit 3.

More specifically, the pressure detecting bridge circuit 3 comprises a total of four diffused resistance elements Rd1, Rd2, Rd3 and Rd4 which are formed on a diaphragm of a semiconductor chip and arranged in a full bridge connection pattern. The resistance value of each of resistance elements Rd1, Rd2, Rd3 and Rd4 varies in response to an applied pressure. In FIG. 1, an up arrow indicates that the resistance value increases in response to an applied pressure. A down arrow indicates that the resistance value decreases in response to the applied pressure. An input terminal P1 of pressure detecting bridge circuit 3 receives a constant voltage applied from a constant-voltage power source terminal +Vcc. Another input terminal P2 of pressure detecting bridge circuit 3 is grounded.

Accordingly, one output terminal Q1 (i.e., a joint point of resistance elements Rd1 and Rd2) of pressure detecting bridge circuit 3 has an electric potential increasing in proportion to the applied pressure. The other output terminal Q2 (i.e., a joint point of resistance elements Rd3 and Rd4) of pressure detecting bridge circuit 3 has an electric potential decreasing in proportion to the applied pressure. Thus, a sensor signal Sd having a voltage level corresponding to the applied pressure is detectable between two output terminals Q1 and Q2. The sensor signal Sd varies in response to the temperature of the pressure detecting bridge circuit 3. The temperature detecting bridge circuit 4 obtains the data required for removing such a temperature drift component.

The temperature detecting bridge circuit 4 comprises a total of four resistance elements Rt1, Rt2, Rc1 and Rc2 which are arranged in a full bridge connection pattern. Each of resistance elements Rt1 and Rt2 are made of a diffused resistor having a temperature coefficient of approximately 1,500 to 1,700 ppm/° C.). Each of resistance elements Rc1 and Rc2 are made of a non-sensitive material, such as CrSi, which has a temperature coefficient of approximately 0. An input terminal P3 of temperature detecting bridge circuit 4 receives the constant voltage applied from the constant-voltage power source terminal +Vcc. Another input terminal P4 of temperature detecting bridge circuit 4 is grounded.

Accordingly, one output terminal Q3 (i.e., a joint point of resistance elements Rt1 and Rc1) of temperature detecting bridge circuit 4 has an electric potential increasing in proportion to a detected temperature. The other output terminal Q4 (i.e., a joint point of resistance elements Rt2 and Rc2) of temperature detecting bridge circuit 4 has an electric potential decreasing in proportion to the detected temperature. Thus, a temperature signal St having a voltage level corresponding to the temperature of the pressure detecting bridge circuit 3 is detectable between two output terminals Q3 and Q4.

The signal processing section 2 comprises the following circuit elements formed on a semiconductor chip.

A reference voltage generating circuit 5 comprises diffused resistance elements Ra1 and Ra2 serially connected between the constant-voltage power source terminal +Vcc and the ground terminal. The resistance elements Ra1 and Ra2 have a same temperature coefficient. The reference voltage generating circuit 5 has an output terminal Q5 (i.e., a joint point of resistance elements Ra1 and Ra2) which outputs a reference signal Sa having a constant voltage level irrespective of the pressure acting on the pressure detecting bridge circuit 3 and the temperature of the pressure detecting bridge circuit 3. It is possible to form the reference voltage generating circuit 5 on the semiconductor chip of the sensing section 1.

An analog multiplexer 6 selectively outputs the sensor signal Sd obtained from the pressure detecting bridge circuit 3, the temperature signal St obtained from the temperature detecting bridge circuit 4, and the reference signal Sa obtained from the reference voltage generating circuit 5 in response to a select signal supplied from a control unit 7.

A high input-impedance differential amplification circuit 8 comprises two operational amplifiers 8a and 8b and three resistors 8c, 8d and 8e. The differential amplification circuit 8 amplifies the output signals successively outputted from the analog multiplexer 6, and sends the amplified signals to an A/D conversion circuit 9. The differential amplification circuit 8 is associated with a constant-voltage power source 8f and a resistor 8g which cooperate to maintain the amplified output voltage at a higher level. Meanwhile, the electric power for differential amplification circuit 8 is supplied from the constant-voltage power source terminal +Vcc.

The A/D conversion circuit 9 comprises a ring-gate delay circuit 10, a circulation frequency counter 11, and a stack memory 12. The ring-gate delay circuit 10 comprises a NAND gate circuit 10a and even inverters 10b connected in a ring pattern. The NAND gate circuit 10a and each inverter 10b have an The circulation frequency counter 11 counts a circulation frequency (i.e., a number of times of complete circulation) of a pulse signal in the ring-gate delay circuit 10. The stack memory 12 stores the count value of the circulation frequency counter 11 as upper bits and stores the output of each inverter 10b as lower bits.

The A/D conversion circuit 9 operates in the following manner. FIG. 2 shows a pulse signal PA applied to the NAND gate 10a in the ring-gate delay circuit 10. The NAND gate 10a and each inverter 10b starts an inverting operation successively in accordance with the power source voltage. The signal circulating operation is continuously performed during an ON duration of the pulse signal PA. Meanwhile, the stack memory 12 receives real-time binary data representing the circulation frequency of the pulse signal. Each build-up of a pulse signal PB shown in FIG. 2 latches the stack memory 12. The pulse signal PB is used to obtain a predetermined sampling period Δt (e.g., equal to or less than 100 μsec). Based on a difference between respective latch data in the stack memory 12, binary data is obtained as a value representing the power source voltage supplied to the inverter 10b.

In this case, the power source voltage is applied from the differential amplification circuit 8 to the NAND gate 10a and each inverter 10b in the ring-gate delay circuit 10. Thus, the A/D conversion circuit 9 converts an output signal of the differential amplification circuit 8 into digital data. In other words, the sensor signal Sd, the temperature signal St and the reference signal Sa, selectively outputted from the analog multiplexer 6, is converted into digital data.

The digital data produced from the A/D conversion circuit 9 are referred to in the following manner:

pressure information D represents the digital data corresponding to the sensor signal Sd;

temperature information T represents the digital data corresponding to the temperature signal St; and reference information A represents the digital data corresponding to the reference signal Sa.

The pressure information D is defined by the following equation (①) based on the voltage P applied to the pressure detecting bridge circuit 3.

$$D=\{(ct+d)\times P+et+f\}\times \beta(t) \qquad (1)$$

where "t" represents a temperature of the pressure detecting bridge circuit 3, "c" represents a temperature coefficient in the sensitivity of the pressure detecting bridge circuit 3, "d" represents a room temperature sensitivity of the pressure detecting bridge circuit 3, "e" represents a temperature coefficient of an offset of a detected pressure value, and "f" represents a room temperature offset value of the detected pressure value.

Furthermore, β(t) is a nonlinear term which is dependent on the temperature characteristics of the differential amplification circuit 8 and the temperature characteristics of the delay time of the ring-gate delay circuit 10. In other words, β(t) is a factor causing deterioration in the pressure detection.

To solve "P" from the equation (①), it is necessary to obtain "t" and remove β(t). To this end, the temperature information T is obtained from the temperature detecting bridge circuit 4 and the reference information A is obtained from the reference voltage generating circuit 5.

The following equation (②) represents the relationship between the temperature information T and the temperature "t" of the pressure detecting bridge circuit 3.

$$T=(at+b)\times \beta(t) \qquad (2)$$

where "a" represents a temperature coefficient of a detected temperature value, and "b" represents a room temperature offset value of the detected temperature value.

To obtain the reference information A, the differential amplification circuit 8 amplifies the reference signal Sa and the A/D conversion circuit 9 converts the amplified signal into digital data. The reference signal Sa has a constant voltage level irrespective of the pressure acting on the pressure detecting bridge circuit 3 and the temperature of the pressure detecting bridge circuit 3. Accordingly, the following relationship (③) is expressed.

$$A=\beta(t) \qquad (3)$$

By solving "P" from the above equations (②) and (③), the nonlinear term β(t) can be deleted as shown in the following equation (④)

$$P=\{(T/A-b)\times(-e/a)+D/A-f\}/\{(T/A-b)\times c/a+d\} \qquad (4)$$

An EPROM 13 stores the coefficient values of "a", "b", "c", "d", "e" and "f" which are required for calculating the pressure "P" defined by the equation (④).

A correction circuit 14 performs the calculation for obtaining the pressure P defined by the equation (④) in response to a command sent from the control unit 7, with reference to the pressure information D, temperature information T and reference information A read from the stack memory 12 in addition to the coefficient values (a, b, c, d, e, f) read from the EPROM 13. The calculation result in the correction circuit 14 is outputted through an I/O block 15 as pressure data representing the detected pressure of the sensing section 1.

FIG. 3 is a flowchart showing a control procedure performed in the control unit 7 in accordance with the first embodiment.

First, in step S1, the control unit 7 sends a first select signal to the analog multiplexer 6. In response to the first select signal, the multiplexer 6 selects the reference signal Sa supplied from the reference voltage generating circuit 5. The differential amplification circuit 8 amplifies the reference signal Sa and produces a voltage signal corresponding to the amplified reference signal Sa. This voltage signal serves as a first signal to be processed in the A/D conversion circuit 9. Namely, the first signal is applied to the ring-gate delay circuit 10 in the A/D conversion circuit 9.

Thereafter, in step S2, the control unit 7 executes a control routine for outputting the pulse signals PA and PB to the A/D conversion circuit 9. More specifically, in the step S2, the control unit 7 generates the pulse signal PA during a time period from t1 to t2 as shown in FIG. 2. Meanwhile, after the time t1, the control unit 7 generates the pulse signal PB which rises four times by the time t2 as shown in FIG. 2.

With such generation of pulse signals PA and PB, the first signal circulates in the ring-gate delay circuit 10 continuously during an on-time of the pulse signal PA. Each build-up of the pulse signal PB latches the stack memory 12. The control unit 7 obtains a difference between latch data, e.g., a difference between the latch data at the third build-up timing and the latch data at the fourth build-up timing. Then, the control unit 7 obtains the digital data representing the reference information A which is dependent on the first signal (i.e., amplified reference signal Sa) supplied from the differential amplification circuit 8.

Then, in step S3, the control unit 7 sends a second select signal to the analog multiplexer 6. In response to the second select signal, the multiplexer 6 selects the temperature signal St supplied from the temperature detecting bridge circuit 4. The differential amplification circuit 8 amplifies the temperature signal St and produces a voltage signal corresponding to the amplified temperature signal St. This voltage signal serves as a second signal to be processed in the A/D conversion circuit 9. Namely, the second signal is applied to the ring-gate delay circuit 10 in the A/D conversion circuit 9.

Thereafter, in step S4, the control unit 7 executes the control routine for outputting the pulse signals PA and PB. More specifically, in the step S4, the control unit 7 generates the pulse signal PA during a time period from t3 to t4 as shown in FIG. 2. Meanwhile, after the time t3, the control unit 7 generates the pulse signal PB which rises several times by the time t4 as shown in FIG. 2.

With such generation of pulse signals PA and PB, the second signal circulates in the ring-gate delay circuit 10 continuously during an on-time of the pulse signal PA. Each build-up of the pulse signal PB latches the stack memory 12. The control unit 7 obtains a difference between latch data. Then, the control unit 7 obtains the digital data representing the temperature information T which is dependent on the second signal (i.e., amplified temperature signal St) supplied from the differential amplification circuit 8.

Then, in step S5, the control unit 7 sends a third select signal to the analog multiplexer 6. In response to the third select signal, the multiplexer 6 selects the sensor signal Sd supplied from the pressure detecting bridge circuit 3. The differential amplification circuit 8 amplifies the sensor signal Sd and produces a voltage signal corresponding to the amplified sensor signal Sd. This voltage signal serves as a third signal to be processed in the A/D conversion circuit 9. Namely, the third signal is applied to the ring-gate delay circuit 10 in the A/D conversion circuit 9.

Thereafter, in step S6, the control unit 7 executes the control routine for outputting the pulse signals PA and PB. More specifically, in the step S6, the control unit 7 generates the pulse signal PA during a time period from t5 to t6 as shown in FIG. 2. Meanwhile, after the time t5, the control unit 7 generates the pulse signal PB which rises several times by the time t6 as shown in FIG. 2.

With such generation of pulse signals PA and PB, the third signal circulates in the ring-gate delay circuit 10 continuously during an on-time of the pulse signal PA. Each build-up of the pulse signal PB latches the stack memory 12. The control unit 7 obtains a difference between latch data.

Then, the control unit 7 obtains the digital data representing the pressure information D which is dependent on the third signal (i.e., amplified sensor signal Sd) supplied from the differential amplification circuit 8.

According to this arrangement, the stack memory 12 produces three kinds of digital data in respective pulse output routines of steps S2, S4 and S6. It is therefore possible to obtain an average of there digital data (i.e., reference information A, temperature information T and pressure information D).

Then, in step S7, the control unit 7 generates a calculation command to the correction circuit 14. In response to this calculation command, the correction circuit 14 performs the calculation for obtaining the pressure P defined by the equation ④, with reference to the pressure information D, the temperature information T and the reference information A read from the stack memory 12 in addition to the coefficient values (a, b, c, d, e, f) read from the EPROM 13. The calculation result in the correction circuit 14 is outputted through the I/O block 15 as pressure data representing the detected pressure of the sensing section 1.

Then, in step S8, the control unit 7 checks whether a predetermined time (i.e., a waiting time) has passed or not. When the judgement result is NO in the step S8, the control unit 7 repeats the judgement of step S8 until the waiting time has passed. When the judgement result is YES in the step S8, the control flow returns to the step S1. Thus, the processing procedure of steps S1 to S7 is cyclically performed at predetermined time intervals.

In short, the above-described first embodiment uses the analog multiplexer 6 which performs the time-divisional processing for successively detecting the sensor signal Sd, the temperature signal St, and the reference signal Sa. The differential amplification circuit 8 and the A/D conversion circuit 9 are commonly used for obtaining the digital data (pressure information D, temperature information T and reference information A) corresponding to the detected signals Sd, St and Sa. Based on the digital data thus obtained, the calculation for obtaining the pressure "P" according to the equation ④ is performed to compensate the temperature deviations in the sensitivity and the offset. Thus, it becomes possible to accurately detect a pressure value.

The above-described first embodiment is simple in circuit arrangement because the differential amplification circuit 8 requires only two operational amplifier 8a and 8b for performing the analog temperature compensation. In other words, it is not necessary to provide numerous operational amplifiers. The overall size of the circuit can be downsized.

The above equation ④ contains T/A and D/A. It will be understood that maintaining these ratio values T/A and D/A at constant values makes it possible to eliminate any adverse influence of the deterioration in the durability.

All of the sensor signal Sd, the temperature signal St and the reference signal Sa are processed in the common analog circuit including the analog multiplexer 6 and the differential amplification circuit 8 and the A/D conversion circuit 9. This is effective to cancel any drift components of respective signals caused due to variation or fluctuation of circuit constants in the signal transmission path. The circuit will not be subjected to the aging problem in the ratio values of T/A and D/A. As a result, it becomes possible to eliminate any influence of the deterioration in the durability, thereby assuring the long-lasting sensing accuracy in the detection of the pressure.

The above-described first embodiment can reduce the number of required differential amplification circuits, because the differential amplification circuit 8 is commonly used for processing all of the sensor signal Sd, the temperature signal St and the reference signal Sa. The overall size of the circuit can be downsized.

The above-described first embodiment uses the A/D conversion circuit 9 including the ring-gate delay circuit 10. The conversion speed is greatly increased, and therefore the sampling time can be greatly reduced. As a result, the sensed pressure value can be promptly calculated within a short time.

Second Embodiment

Figure 4:
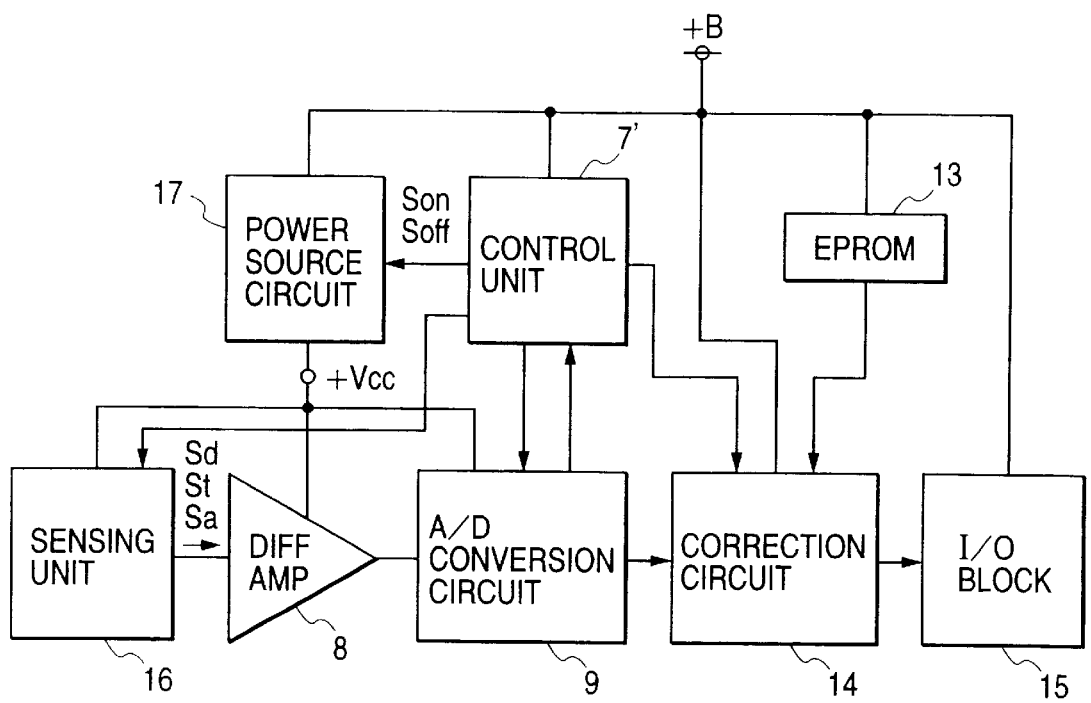
FIG. 4 is a schematic circuit diagram showing an overall arrangement of a semiconductor pressure sensing apparatus in accordance with a second embodiment of the present invention.
Figure 5:
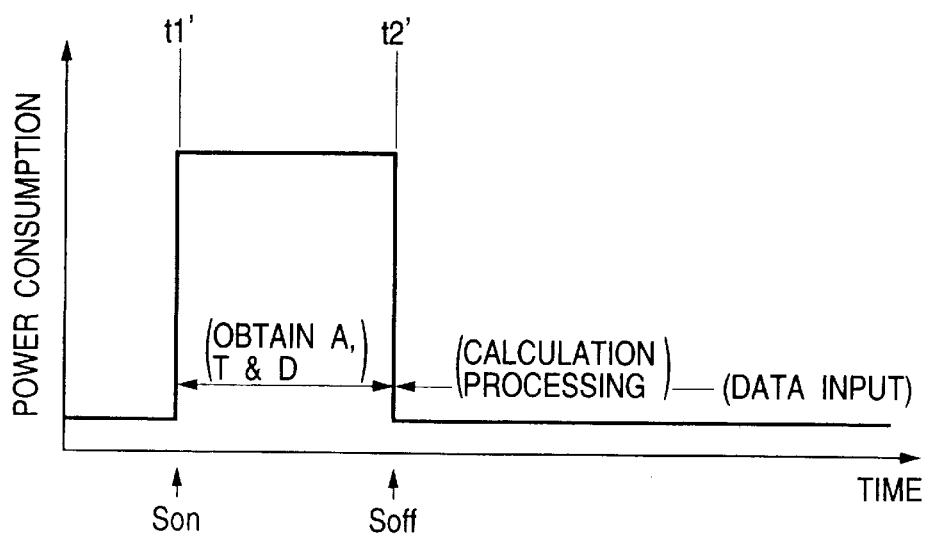
FIG. 5 is a timing chart showing the operation of the semiconductor pressure sensing apparatus in accordance with the second embodiment of the present invention.
Figure 6:
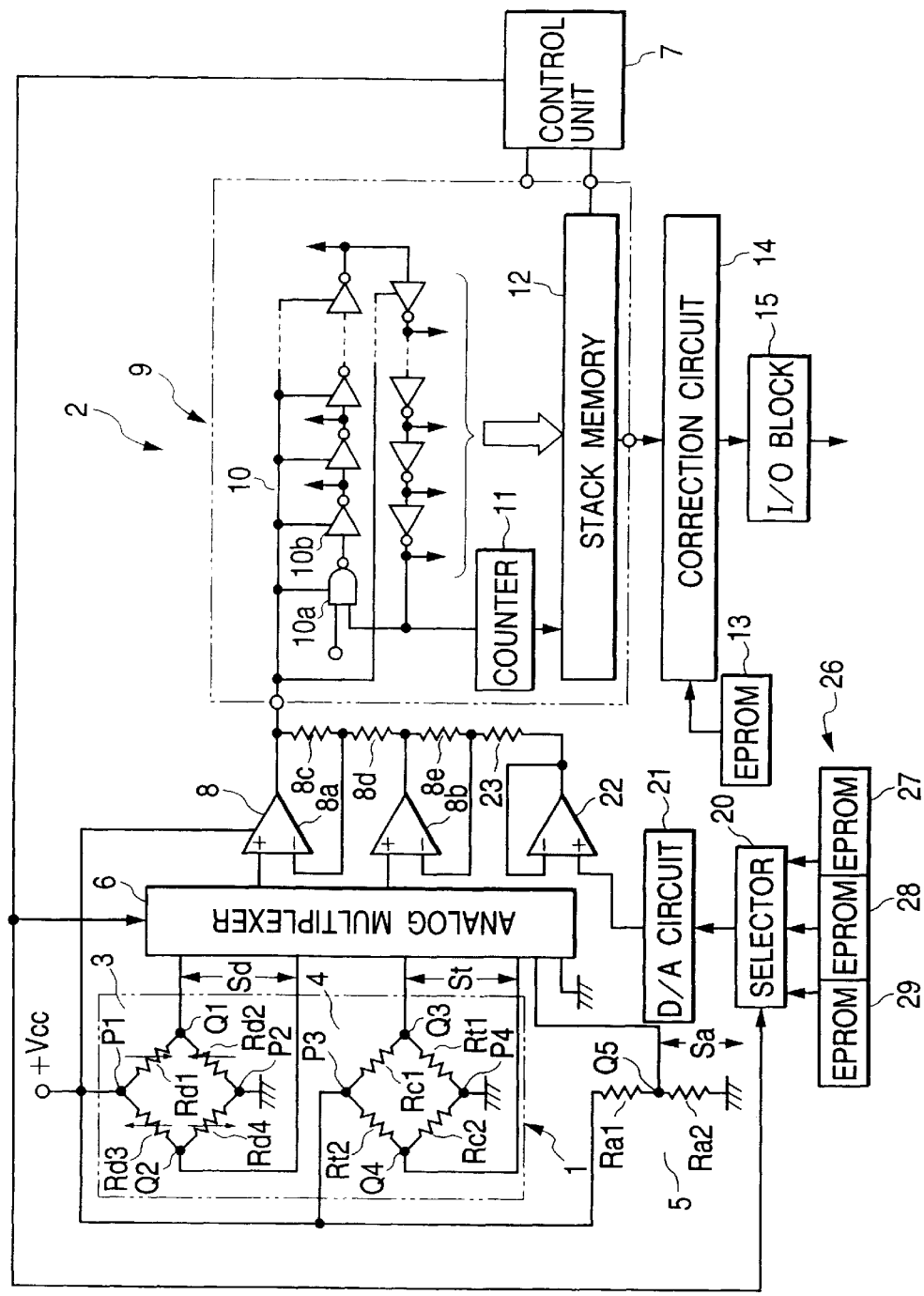
FIG. 6 is a circuit diagram showing an overall arrangement of a semiconductor pressure sensing apparatus in accordance with a third embodiment of the present invention.

FIGS. 4 and 5 cooperatively show a semiconductor pressure sensing apparatus in accordance with a second embodiment of the present invention. FIG. 4 is a schematic block diagram showing an overall arrangement of a sensing apparatus. The sensing apparatus includes the differential amplification circuit 8 and the A/D conversion circuit 9 identical with those disclosed in the first embodiment. The sensing section 1 (including the pressure detecting bridge circuit 3 and the temperature detecting bridge circuit 4), the reference voltage generating circuit 5, and the analog multiplexer 6 of the first embodiment are integrated into a sensing unit 16. The sensing unit 16 produces the sensor signal Ds, the temperature signal St and the reference signal Sa.

A power source circuit 17 is connected to an output terminal +B of a battery (not shown), and produces a constant voltage from its constant-voltage terminal +Vcc in an activated condition. The constant-voltage output of the power source circuit 17 is supplied to each of the sensing unit 16, the differential amplification circuit 8 and the A/D conversion circuit 9. A control unit 7' generates a command signal to selectively start or stop the operation of power source circuit 17. More specifically, the power source circuit 17 starts the operation in response to a power on command signal Son and stops the operation in response to a power off command signal Soff. Electric power is supplied to the control unit 7', the EPROM 13, the correction circuit 14 and the I/O block 15 from the above-described battery (not disclosed).

The control unit 7' performs the same operation as that of the control unit 7 disclosed in the first embodiment. Furthermore, the control unit 7' has the following control function.

FIG. 5 shows the time transition characteristics of an overall power consumption. The control unit 7' sends the power supply command signal Son to the power source circuit 17 at a predetermined timing t1'. For example, the timing t1' may be responsive to a sensing operation start command received from an external microcomputer (not shown) or identical with a cyclic sensing operation timing being set by a timer. In response to the power on command signal Son, the power source circuit 17 starts supplying electric power to each of the sensing unit 16, the differential amplification circuit 8, and the A/D conversion circuit 9. Thus, the power consumption increases at the timing t1' as shown in FIG. 5.

After finishing the above power supply operation, the control unit 7' obtains the digital data (reference information A, temperature information T, and pressure information D) corresponding to the reference signal Sa, the temperature signal St, and the sensor signal Sd supplied from the sensing unit 16. In other words, the control unit 7' performs the same operation as the control unit 7 does in the first embodiment with reference to FIG. 3.

After finishing the above digital data acquiring operation, the control unit 7' sends the power off command signal Soff to the power source circuit 17 at a predetermined timing t2'. In response to the power off command signal Soff, the power source circuit 17 stops supplying electric power to the sensing unit 16, the differential amplification circuit 8, and the A/D conversion circuit 9. Thus, the power consumption decreases at the timing t2' as shown in FIG. 5.

After finishing the above power stopping operation, the control unit 7' generates a calculation command to the correction circuit 14. In response to the calculation command, the correction circuit 14 calculates a detected pressure value and outputs the obtained result as the pressure data through the I/O block 15.

According to the above-described second embodiment, electric power supply to the analog circuit is stopped after the timing t2'. In other words, the second embodiments provides a circuit system capable of saving the electric power after finishing the necessary operations of the sensing unit 16, the differential amplification circuit 8, and the A/D conversion circuit 9. The power-off condition is maintained until an arrival of the next sensing timing. As a result, the total power consumption reduces. This is especially useful when the circuit system is driven by a battery.

Third Embodiment

In the above-described embodiment ④, it is important to erase the nonlinear term $\beta(t)$. However, deletion of the nonlinear term $\beta(t)$ is feasible only when all of nonlinear terms $\beta(t)$ in the above-described equations ① to ③ identical with each other. To realize this, the pressure information D, the temperature information T and the reference information A must be identical in their operating points.

However, in a practical circuit arrangement, the pressure information D, the temperature information T and the reference information A are detected by the pressure detecting bridge circuit 3, the temperature detecting bridge circuit 4 and the reference voltage generating circuit 5 which are inevitably subjected to the offset derived from the dispersion in respective resistance values. The offset possibly causes the pressure information D, the temperature information T and the reference information A to deviate from the required design values. In other words, the deleting condition for the nonlinear term $\beta(t)$ may not be established. In such a case, the pressure data calculated from the equation ④ will include an error component of the nonlinear term $\beta(t)$. The sensing accuracy will be worsened in the detection of the pressure.

To solve such a problem, the third embodiment provides a compensation circuit 26 in the signal processing section 2. The compensation circuit 26 includes three EPROMs 27, 28 and 29 which store correction data (i.e., voltage data) which are memorized in advance in the manufacturing process of the pressure sensing apparatus.

When a standard pressure is applied to the pressure detecting bridge circuit 3, the sensor signal Sd is produced. The differential amplification circuit 8 amplifies the sensor signal Sd and produces an actual sensor output having a voltage level corresponding to the amplified sensor signal Sd.

EPROM 27 stores a quantized correction voltage Vd which corresponds to a difference between the voltage level of the actual sensor output produced from the differential amplification circuit 8 and a standard pressure voltage level.

When the temperature detecting bridge circuit 4 is maintained at a standard temperature, the temperature signal St is produced. The differential amplification circuit 8 amplifies the temperature signal St and produces an actual temperature output having a voltage level corresponding to the amplified temperature signal St.

EPROM 28 stores a quantized correction voltage Vt which corresponds to a difference between the voltage level of the actual temperature output produced from the differential amplification circuit 8 and a standard temperature voltage level.

The reference voltage generating circuit 5 produces the reference signal Sa. The differential amplification circuit 8 amplifies the temperature signal Sa and produces an actual reference output having a voltage level corresponding to the amplified reference signal Sa.

EPROM 29 stores a quantized correction voltage Va which corresponds to a difference between the voltage level of the actual reference output produced from the differential amplification circuit 8 and a standard reference voltage level.

A selector 20 is connected EPROMs 27, 28 and 29 to selectively output the correction voltage data stored in EPROMs 27, 28 and 29 in response to a select signal supplied from the control unit 7. D/A conversion circuit 21 receives the correction voltage data supplied through the selector 20 and converts the correction voltage data into analog voltage signals. A buffer 22 and a resistor 23, cooperatively serving as an impedance adjusting means, are connected between the D/A conversion circuit 21 and the differential amplification circuit 8. Thus, the analog voltage signal produced from D/A conversion circuit 21 is added to the analog output signal of the differential amplification circuit 8.

Figure 7:
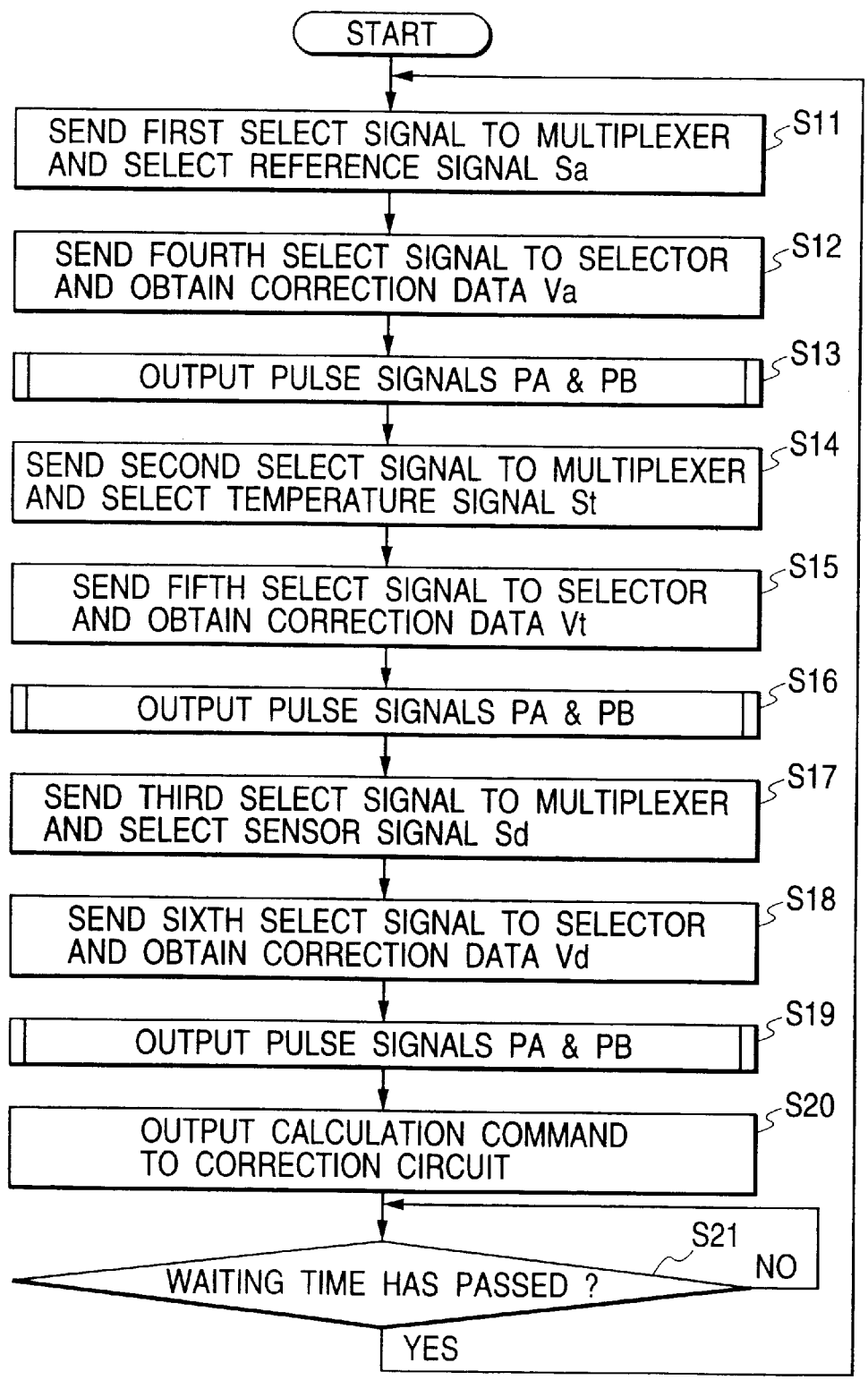
FIG. 7 is a flowchart showing a control procedure performed in a control unit of the semiconductor pressure sensing apparatus in accordance with the third embodiment of the present invention.

FIG. 7 is a flowchart showing a control processing procedure performed in the control unit 7 in accordance with the third embodiment.

First, in step S11, the control unit 7 sends a first select signal to the analog multiplexer 6. In response to the first select signal, the multiplexer 6 selects the reference signal Sa supplied from the reference voltage generating circuit 5. Furthermore, in step S12, the control unit 7 sends a fourth select signal to the selector 20 in the compensation circuit 26. In response to the fourth select signal, the selector 20 selects the correction voltage data Va stored in EPROM 29. Thus, the differential amplification circuit 8 amplifies the reference signal Sa and produces a voltage signal corresponding to the amplified reference signal Sa. The D/A conversion circuit 21 produces a voltage signal corresponding to the correction voltage data Va. These voltage signals are added as a fourth signal to be processed in the A/D conversion circuit 9. Namely, the fourth signal is applied to the ring-gate delay circuit 10 in the A/D conversion circuit 9.

Thereafter, in step S13, the control unit 7 executes a control routine for outputting the pulse signals PA and PB to the A/D conversion circuit 9. As explained in the first embodiment, the control unit 7 generates the pulse signal PA during a time period from t1 to t2 as shown in FIG. 2. Meanwhile, after the time t1, the control unit 7 generates the pulse signal PB which rises four times by the time t2 as shown in FIG. 2.

With such generation of pulse signals PA and PB, the fourth signal circulates in the ring-gate delay circuit 10 continuously during an on-time of the pulse signal PA. Each build-up of the pulse signal PB latches the stack memory 12. The control unit 7 obtains a difference between latch data, e.g., a difference between the latch data at the third build-up timing and the latch data at the fourth build-up timing. Then, the control unit 7 obtains the digital data representing the reference information A which is dependent on the fourth signal (i.e., amplified reference signal Sa+ correction voltage signal Va) supplied from the differential amplification circuit 8.

Then, in step S14, the control unit 7 sends a second select signal to the analog multiplexer 6. In response to the second select signal, the multiplexer 6 selects the temperature signal St supplied from the temperature detecting bridge circuit 4. Furthermore, in step S15, the control unit 7 sends a fifth select signal to the selector 20. In response to the fifth select signal, the selector 20 selects the correction voltage data Vt stored in EPROM 28. Thus, the differential amplification circuit 8 amplifies the temperature signal St and produces a voltage signal corresponding to the amplified temperature signal St. The D/A conversion circuit 21 produces a voltage signal corresponding to the correction voltage data Vt. These voltage signals are added as a fifth signal to be processed in the A/D conversion circuit 9. Namely, the fifth signal is applied to the ring-gate delay circuit 10 in the A/D conversion circuit 9.

Thereafter, in step S16, the control unit 7 executes the control routine for outputting the pulse signals PA and PB. More specifically, in the step S16, the control unit 7 generates the pulse signal PA during a time period from t3 to t4 as shown in FIG. 2. Meanwhile, after the time t3, the control unit 7 generates the pulse signal PB which rises several times by the time t4 as shown in FIG. 2.

With such generation of pulse signals PA and PB, the fifth signal circulates in the ring-gate delay circuit 10 continuously during an on-time of the pulse signal PA. Each build-up of the pulse signal PB latches the stack memory 12. The control unit 7 obtains a difference between latch data. Then, the control unit 7 obtains the digital data representing the temperature information T which is dependent on the fifth signal (i.e., amplified temperature signal St+ correction voltage signal Vt) supplied from the differential amplification circuit 8.

Then, in step S17, the control unit 7 sends a third select signal to the analog multiplexer 6. In response to the third select signal, the multiplexer 6 selects the sensor signal Sd supplied from the pressure detecting bridge circuit 3. Furthermore, in step S18, the control unit 7 sends a sixth select signal to the selector 20. In response to the sixth select signal, the selector 20 selects the correction voltage data Vd stored in EPROM 27. Thus, the differential amplification circuit 8 amplifies the sensor signal Sd and produces a voltage signal corresponding to the amplified sensor signal Sd. The D/A conversion circuit 21 produces a voltage signal corresponding to the correction voltage data Vd. These voltage signals are added as a sixth signal to be processed in the A/D conversion circuit 9. Namely, the sixth signal is applied to the ring-gate delay circuit 10 in the A/D conversion circuit 9.

Thereafter, in step S19, the control unit 7 executes the control routine for outputting the pulse signals PA and PB. More specifically, in the step S19, the control unit 7 generates the pulse signal PA during a time period from t5 to t6 as shown in FIG. 2. Meanwhile, after the time t5, the control unit 7 generates the pulse signal PB which rises several times by the time t6 as shown in FIG. 2.

With such generation of pulse signals PA and PB, the sixth signal circulates in the ring-gate delay circuit 10 continuously during an on-time of the pulse signal PA. Each build-up of the pulse signal PB latches the stack memory 12. The control unit 7 obtains a difference between latch data.

Then, the control unit 7 obtains the digital data representing the pressure information D which is dependent on the sixth signal (i.e., amplified sensor signal Sd+ correction voltage signal Vd) supplied from the differential amplification circuit 8.

According to this arrangement, the stack memory 12 produces three kinds of digital data in respective pulse output routines of steps S13, S16 and S19. It is therefore possible to obtain an average of there digital data (i.e., reference information A, temperature information T and pressure information D).

Then, in step S20, the control unit 7 generates a calculation command to the correction circuit 14. In response to the calculation command, the correction circuit 14 performs the calculation for obtaining the pressure P defined by the equation ④, with reference to the pressure information D, temperature information T and reference information A read from the stack memory 12 in addition to the coefficient values (a, b, c, d, e, f) read from the EPROM 13. The calculation result in the correction circuit 14 is outputted through the I/O block 15 as pressure data representing the detected pressure of the sensing section 1.

Then, in step S21, the control unit 7 checks whether a predetermined time (i.e., a waiting time) has passed or not. When the judgement result is NO in the step S21, the control unit 7 repeats the judgement of step S21 until the waiting time has passed. When the judgement result is YES in the step S21, the control flow returns to the step S11. Thus, the processing procedure of steps S11 to S20 is cyclically performed at predetermined time intervals.

In short, the above-described third embodiment makes it possible to accurately or completely remove the nonlinear components from the above-described equation ④, although the nonlinear components are usually dependent on the temperature characteristics of the differential amplification circuit 8 or the temperature characteristics of the delay time of the ring-gate delay circuit 10. The correction circuit 14 performs the processing for calculating the detected pressure value based on the pressure information D, the temperature information T and the reference information A supplied from the A/D conversion circuit 9.

As described above, in a conventional circuit arrangement, there is a problem that the pressure detecting bridge circuit 3, the temperature detecting bridge circuit 4 and the reference voltage generating circuit 5 are inevitably subjected to the offset. And, the offset possibly causes the pressure information D, the temperature information T and the reference information A to deviate from the required design values.

On the other hand, the above-described third embodiment provides the compensation circuit 26 which include EPROMs 27, 28 and 29 storing the correction voltage data Vd, Vt and Va for compensating the offset amounts of the sensor signal Sd, the temperature signal St and the reference signal Sa under the same condition, when the sensor signal Sd, the temperature signal St and the reference signal Sa are supplied from the pressure detecting bridge circuit 3, the temperature detecting bridge circuit 4, and the reference voltage generating circuit 5, respectively.

In other words, the third embodiment provides the compensation circuit 26 which is capable of correcting the sensor signal Sd, the temperature signal St and the reference signal Sa by the amounts corresponding to the correction voltage data Vd, Vt and Va before these signals are supplied to the ring-gate delay circuit 10 in the A/D conversion circuit 9.

With this arrangement, it becomes possible to completely remove the error components resulting from the offsets from the digital data (i.e., pressure information D, temperature information T and the reference information A) produced from the A/D conversion circuit 9. In the correction circuit 14, the processing for calculating the detected pressure data can be performed based on the A/D conversion data without including the nonlinear component. Thus, it becomes possible to sufficiently increase the accuracy in the detection of the pressure.

The A/D conversion circuit 9 including the ring-gate delay circuit 10 can increase the conversion speed. Therefore, the sampling time can be greatly reduced. As a result, the sensed pressure value can be promptly calculated within a short time.

The third embodiment includes the analog multiplexer 6 selectively outputting the sensor signal Sd, the temperature signal St, and the reference signal Sa. Thus, there is no necessity of providing a plurality of A/D conversion circuits.

The third embodiment includes the differential amplification circuit 8 amplifying the signal to be supplied to the A/D conversion circuit 9. The sensing accuracy can be improved. As the differential amplification circuit 8 is located at a position succeeding the analog multiplexer 8, there is no necessity of providing a plurality of differential amplification circuits.

The correction voltage data Vd, Vt and Va are memorized as quantized data in EPROMs 27, 28 and 29. It is simple to memorize the correction voltage data Vd, Vt and Va in the manufacturing process of the pressure sensing apparatus. The memorization can be accurately performed.

The pressure detecting bridge circuit 3 and the temperature detecting bridge circuit 4 are formed on the same semiconductor chip. Thus, the actual temperature of the pressure detecting bridge circuit 3 is accurately detectable by the temperature detecting bridge circuit 4. The temperature correction for the detected pressure value can be accurately done in the calculating processing performed in the correction circuit 14.

To increase the conversion accuracy of the A/D conversion circuit 9, the amplification rate of the differential amplification circuit 8 can be determined in the following manner.

The differential amplification circuit 8 successively produces the voltage signal representing the amplified value of the sensor signal Sd, the temperature signal St, and the reference signal Sa. The voltage signal of the differential amplification circuit 8 is applied to the ring-gate delay circuit 10 in the A/D conversion circuit 9. The circulation frequency counter 11 counts the circulation frequency of the pulse signal during the sampling period Δt. The circulation frequency varies in accordance with the voltage level of the applied power source voltage (i.e., the sensor signal Sd, the temperature signal St, or the reference signal Sa). Thus, the A/D conversion circuit 9 finally outputs the binary-coded digital data which are the count values corresponding to the analog signals Sd, St and Sa obtained from the circulation frequency counter 11.

To improve the sensitivity of the A/D conversion circuit 9, it is desirable to increase the amplification rate in the differential amplification circuit 8 so that the voltage modulation width can be increased.

Figure 8:
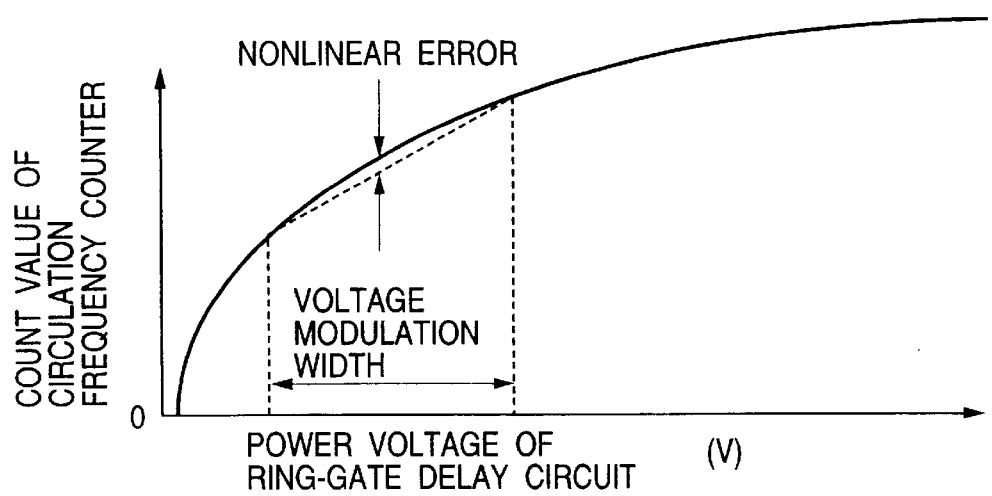
FIG. 8 is a graph showing the relationship between the power source voltage of a ring-gate delay circuit and the count value of a circulation frequency counter.

The relationship between the power source voltage of the ring-gate delay circuit 10 and the count value of the circulation frequency counter 11 is nonlinear as shown in FIG. 8. The nonlinear relationship is derived from the fact the delay time of the ring-gate delay circuit 10 contains a nonlinear component as shown in the following equation (5).

$$tpd = k(t) \cdot C_L \cdot V_{DD}/(V_{DD}-Vth)^\alpha \qquad (5)$$

where tpd represents the delay time of the ring-gate delay circuit 10, k(t) represents the a proportional constant, α represents a constant (approximately 1.3), $C_L$ represents a wiring capacitance of the ring-gate delay circuit 10, $V_{DD}$ represents the power source voltage, and Vth represents a threshold voltage.

If the amplification rate of the differential amplification circuit 8 is increased excessively, the count value of the circulation frequency counter 11 will cause a large nonlinear error which deteriorates the conversion accuracy of the A/D conversion circuit 9.

Figure 9:
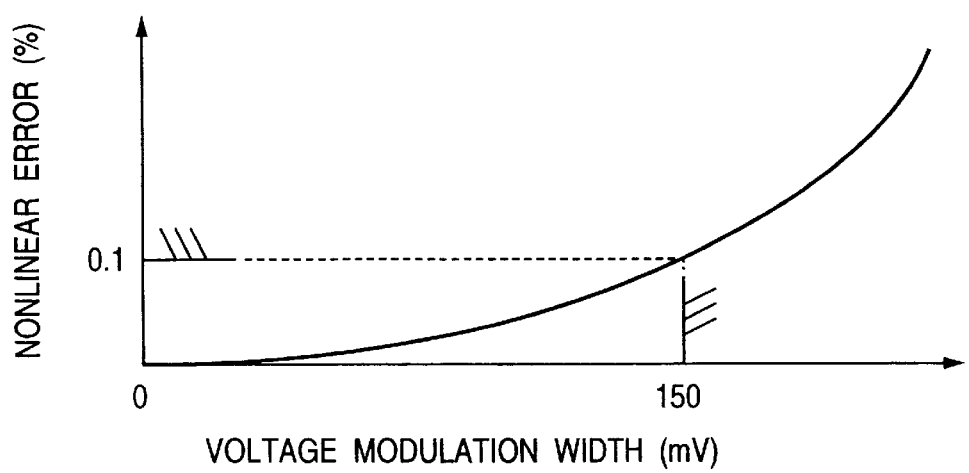
FIG. 9 is a graph showing the relationship between the voltage modulation width in a differential amplification circuit and the nonlinear error caused in the count value in a circulation frequency counter.

As shown in FIG. 9, the nonlinear error component is within 0.1% when the differential amplification circuit 8 has a voltage modulation width smaller than 150 mV. The general sensors are usually required to have the nonlinear error level equal to or smaller than 0.1%.

The third embodiment determines the amplification rate of the differential amplification circuit 8 in such a manner that a difference between a maximum value and a minimum value of the voltage signal produced from the differential amplification circuit 8 becomes within 150 mV. Accordingly, the nonlinear error component becomes 0.1% or less in the counter value of the circulation frequency counter 11.

Accordingly, it becomes possible to adequately enlarge the modulation width of the power source voltage applied to the ring-gate delay circuit 10 in the A/D conversion circuit 9. Furthermore, it becomes possible to suppress the error caused in the signal circulation frequency (i.e., count value of the circulation frequency counter 11) in the ring-gate delay circuit 10. As a result, not only the sensitivity of the A/D conversion circuit 9 is improved but also the conversion accuracy can be increased. Thus, the sensing accuracy (i.e., accuracy in the detection of the pressure) can be improved.

To improve the sensing accuracy, it is desirable to increase the resolution of the A/D conversion circuit 9. The count value of the circulation frequency counter 11, i.e., conversion data obtained in the A/D conversion circuit 9, indicates the number of times of complete circulation of the pulse signal in the ring-gate delay circuit 10 during the predetermined sampling period Δt. A large count value will be obtained when the sampling time Δt is elongated. The count value varies linearly with respect to the time, without causing a nonlinear error.

Accordingly, it is possible to determine the resolution of the A/D conversion circuit 9 in accordance with the sampling time Δt. In the third embodiment, the sampling time Δt is set to be equal to or larger than 50 μsec. The resolution of A/D conversion circuit 9 becomes 12 bits or above.

Thus, the practical conversion accuracy becomes a satisfactory level. Even if the power source voltage includes a noise component, such a noise component reduces due to the integration effect when the A/D conversion circuit 9 has the sampling period At equal to or larger than 50 μsec. Thus, it becomes possible to remove the adverse effects of the noise and further improve the sensing accuracy.

The signal determining the sampling frequency Δt is obtained by dividing a clock signal given to the signal processing section 2. This is effective to sufficiently increase the frequency of the clock signal. As a result, other signals are also speedily processed in the signal processing section 2.

In the above-described embodiment, it is possible to remove the analog multiplexer 6 when the signal processing section 2 includes three A/D conversion circuits 3. These A/D conversion circuits can be formed on the same semiconductor chip. In this case, the electric characteristics of these A/D conversion circuits are strictly agreeable, without causing any problem in the signal processing procedure.

Furthermore, the differential amplification circuit 8 can be replaced by an impedance conversion circuit.

Fourth Embodiment

A fourth embodiment differs from the third embodiment in the control performed in the control unit 7. Hereinafter, the control processing procedure of the fourth embodiment will be explained with reference to a flowchart shown in FIG. 11 and a time chart shown in FIG. 10.

Figure 10:
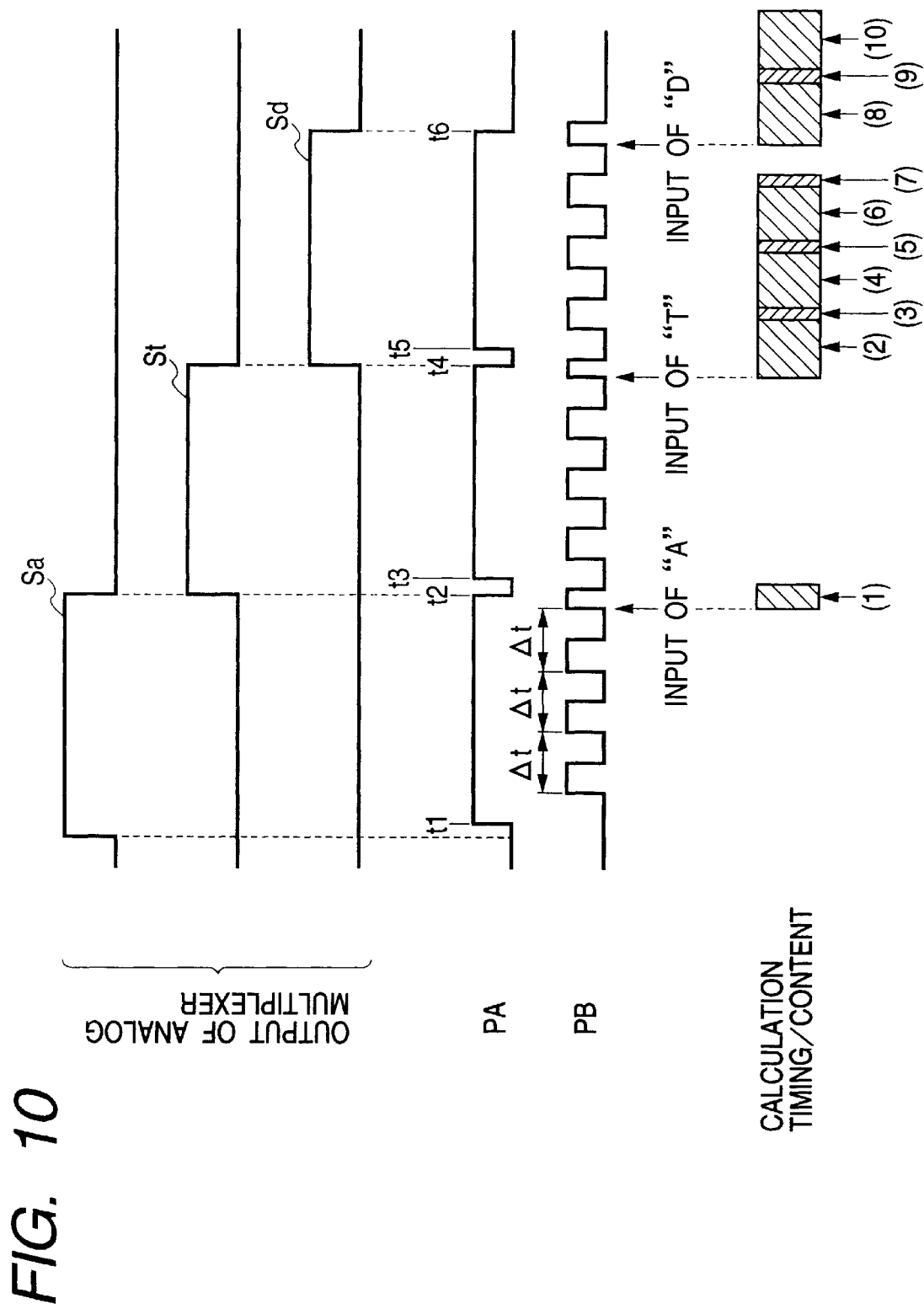
FIG. 10 is a timing chart showing the operation of the semiconductor pressure sensing apparatus in accordance with a fourth embodiment of the present invention.
Figure 11:
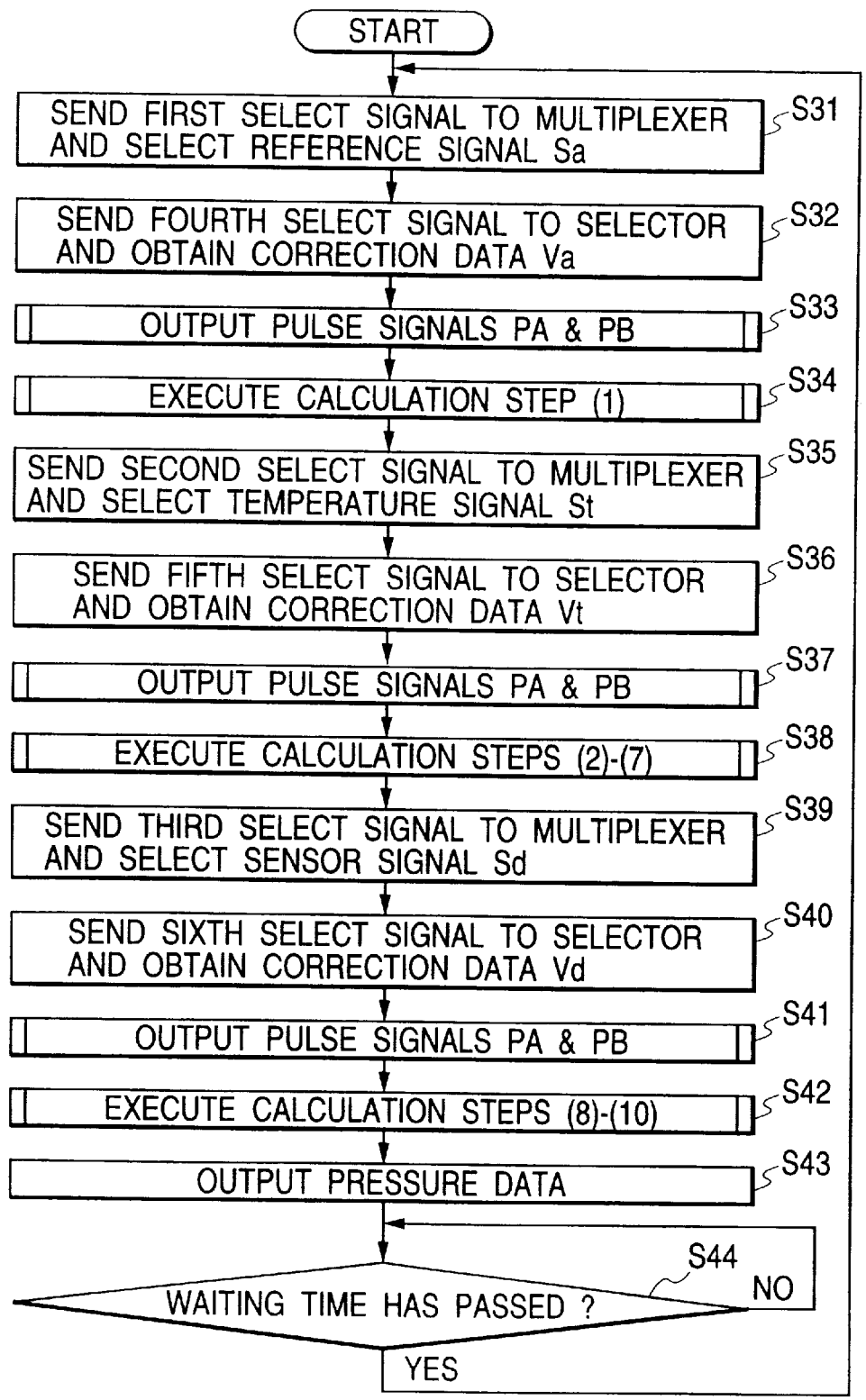
FIG. 11 is a flowchart showing a control procedure performed in a control unit of the semiconductor pressure sensing apparatus in accordance with the fourth embodiment of the present invention.

The time chart of FIG. 10 shows the output timing of signals Sa, St and Sd produced from the analog multiplexer 6, the signal output timing of pulse signals PA and PB, and the calculation timing/content of the correction circuit 14 (indicated by numerals (1) to (10)).

First, in step S31, the control unit 7 sends the first select signal to the analog multiplexer 6 in the same manner as in the step S11 of FIG. 7. In response to the first select signal, the multiplexer 6 selects the reference signal Sa (refer to FIG. 10) supplied from the reference voltage generating circuit 5. Furthermore, in step S32, the control unit 7 sends the fourth select signal to the selector 20 in the same manner as in the step S12 of FIG. 7. In response to the fourth select signal, the selector 20 selects the correction voltage data Va stored in EPROM 29. The differential amplification circuit 8 amplifies the reference signal Sa and produces the voltage signal corresponding to the amplified reference signal Sa. The D/A conversion circuit 21 produces the voltage signal corresponding to the correction voltage data Va. These voltage signals corresponding to Sa and Va are added as the fourth signal and applied to the ring-gate delay circuit 10 in the A/D conversion circuit 9.

Thereafter, in step S33, the control unit 7 outputs the pulse signals PA and PB to the A/D conversion circuit 9 in the same manner as in the step S13 of FIG. 7. The control unit 7 generates the pulse signal PA during a time period from t1 to t2 as shown in FIG. 10. Meanwhile, after the time t1, the control unit 7 generates the pulse signal PB which rises four times by the time t2 as shown in FIG. 10.

The fourth signal circulates in the ring-gate delay circuit 10 continuously during an on-time of the pulse signal PA. Each build-up of the pulse signal PB latches the stack memory 12. The control unit 7 obtains a difference between latch data. Then, the control unit 7 obtains the digital data representing the reference information A which is dependent on the fourth signal (i.e., amplified reference signal Sa+correction voltage signal Va) supplied from the differential amplification circuit 8.

After acquiring the reference information A, the control unit 7 causes the correction circuit 14 to execute the calculation for obtaining a complement of the reference information A. More specifically, step S34 executed the following calculation step (1).

The above-described equation (4) includes T/A. The reference information A is binary data. When the division of T/A is accomplished by the use of adder(s), it is necessary to obtain the complement of 2 with respect to the reference information A. For this end, each digit of A exchanges 1 for 0 or vice versa to obtain the complement of 1. Then, by adding 1 to the resultant complement of 1, the complement of 2 is obtained.

Then, in step S35, the control unit 7 sends the second select signal to the analog multiplexer 6 in the same manner as in the step S14 of FIG. 7. In response to the second select signal, the multiplexer 6 selects the temperature signal St (refer to FIG. 10) supplied from the temperature detecting bridge circuit 4. Furthermore, in step S36, the control unit 7 sends the fifth select signal to the selector 20 in the same manner as in the step S15 of FIG. 7. In response to the fifth select signal, the selector 20 selects the correction voltage data Vt stored in EPROM 28. The differential amplification circuit 8 amplifies the temperature signal St and produces the voltage signal corresponding to the amplified temperature signal St. The D/A conversion circuit 21 produces the voltage signal corresponding to the correction voltage data Vt. These voltage signals corresponding to St and Vt are added as the fifth signal and applied to the ringgate delay circuit 10 in the A/D conversion circuit 9.

Thereafter, in step S37, the control unit 7 outputs the pulse signals PA and PB to the A/D conversion circuit 9 in the same manner as in the step S16 of FIG. 7. The control unit 7 generates the pulse signal PA during a time period from t3 to t4 as shown in FIG. 10. Meanwhile, after the time t3, the control unit 7 generates the pulse signal PB which rises several times by the time t4 as shown in FIG. 10.

The fourth signal circulates in the ring-gate delay circuit 10 continuously during an on-time of the pulse signal PA. Each build-up of the pulse signal PB latches the stack memory 12. The control unit 7 obtains a difference between latch data. Then, the control unit 7 obtains the digital data representing the temperature information T which is dependent on the fifth signal (i.e., temperature signal St+ correction voltage signal Vt) supplied from the differential amplification circuit 8.

After acquiring the temperature information T, the control unit 7 causes the correction circuit 14 to execute the following calculation steps (2) through (7) by using the temperature information T, the complement of the reference information A, and the correction coefficients a, b, c, d, e and f. In these calculations, the pressure information D is not required.

Step (2)—$T/A = \delta 1$

Step (3)—$T/A - b = 67\ 1 - b = 67\ 2$

Step (4)—$(T/A - b) \times (-e/a) = 67\ 2 \times (-e/a) = \delta 3$

Step (5)—$(T/A - b) \times (-e/a) - f = \delta 3 - f = \delta 4$

Step (6)—$(T/A - b) \times c/a = 67\ 2 \times c/a = 67\ 5$

Step (7)—$(T/A - b) \times c/a + d = 67\ 5 + d = \delta 6$

Then, in step S39, the control unit 7 sends the third select signal to the analog multiplexer 6 in the same manner as in the step S17 of FIG. 7. In response to the third select signal, the multiplexer 6 selects the sensor signal Sd supplied from the pressure detecting bridge circuit 3. Furthermore, in step S40, the control unit 7 sends the sixth select signal to the selector 20 in the same manner as in the step S18 of FIG. 7. The selector 20 selects the correction voltage data Vd stored in EPROM 27. The differential amplification circuit 8 amplifies the sensor signal Sd and produces the voltage signal corresponding to the amplified sensor signal Sd. The D/A conversion circuit 21 produces the voltage signal corresponding to the correction voltage data Vd. These voltage signals corresponding to Sd and Vd are added as the sixth signal and applied to the ring-gate delay circuit 10 in the A/D conversion circuit 9.

Thereafter, in step S41, the control unit 7 outputs the pulse signals PA and PB in the same manner as in the step S19 of FIG. 7. The control unit 7 generates the pulse signal PA during a time period from t5 to t6 as shown in FIG. 10. Meanwhile, after the time t5, the control unit 7 generates the pulse signal PB which rises several times by the time t6 as shown in FIG. 10.

The sixth signal circulates in the ring-gate delay circuit 10 continuously during an on-time of the pulse signal PA. Each build-up of the pulse signal PB latches the stack memory 12. The control unit 7 obtains a difference between latch data. The control unit 7 obtains the digital data representing the pressure information D which is dependent on the sixth signal (i.e., amplified sensor signal Sd+ correction voltage signal Vd) supplied from the differential amplification circuit 8.

As described in the first and second embodiments, it is possible to obtain an average of there digital data (i.e., reference information A, temperature information T and pressure information D) obtained in respective pulse output routines of steps S33, S37 and S41.

After acquiring the pressure information D, the control unit 7 causes the correction circuit 14 to execute the following calculation steps (8) through (10) by using the temperature information D and the calculation result in the above steps S34 and S38. The last calculation step (10) is for obtaining the pressure P defined by the above-defined equation (4).

Step (8)—$D/A = \delta 7$

Step (9)—$(T/A - b) \times (-e/a) - f + D/A = \delta 4 + \delta 7 = \delta 8$

Step (10)—$\{(T/A - b) \times (-e/a) - f + + D/A\}/\{(T/A - b) \times c/a + d\} = \delta 8 / \delta 6$ After finishing the calculation routine of step S42, the calculation result of the correction circuit 14 is outputted through the I/O block 15 as pressure data representing the detected pressure of the sensing section 1 (refer to step S43).

Then, in step S44, the control unit 7 checks whether a predetermined time (i.e., a waiting time) has passed or not. When the judgement result is NO in the step S44, the control unit 7 repeats the judgement of step S44 until the waiting time has passed. When the judgement result is YES in the step S44, the control flow returns to the step S31. Thus, the processing procedure of steps S31 to S43 is cyclically performed at predetermined time intervals.

According to the above-described fourth embodiment, the correction circuit 14 performs the calculation step (1) for obtaining the complement with respect to the digital data of reference information A corresponding to the reference signal Sa generated from the analog multiplexer 6 prior to the sensor signal Sd and the temperature signal St. Then, the correction circuit 14 performs the calculation steps (2) to (7) based on the digital data of temperature information corresponding to the temperature signal St next generated from the analog multiplexer 6 prior to the sensor signal Sd. Namely, the calculation result of $\{(T/A-b) \times (-e/a) - f\}$ and the calculation result of $\{(T/A-b) \times c/a + d\}$ are obtained. Finally, the correction circuit 14 performs the calculation steps (8) to (10) based on the digital data of pressure information D corresponding to the sensor signal Sd generated from the analog multiplexer 6. Namely, the calculation result of $\{(T/A-b) \times (-e/a) - f + D/A\}/\{(T/A-b) \times c/a + d\}$ is obtained as the detected pressure value.

In the calculation for obtaining the applied pressure P, the terms $\{(T/A-b) \times (-e/a) - f\}$ and $\{(T/A-b) \times c/a + d\}$ are not related to the pressure information D. Thus, the fourth embodiment makes it possible to execute the calculations of $\{(T/A-b) \times (-e/a) - f\}$ and $\{(T/A-b) \times c/a + d\}$ in advance. The A/D conversion circuit 9 requires a significant amount of sampling time (equivalent to 100 $\mu$sec) for outputting the conversion data. Hence, as shown in FIG. 10, the correction circuit 14 executes the calculation step (1) based on the reference information A at an earlier timing (t2–t3) and subsequently executes the calculation steps (2) through (7) based on the temperature information T during the sampling period (t4–t6) of pressure information D. After obtaining the pressure information D, the correction circuit 14 executes the remaining calculation steps (8) through (10). As many of calculation steps (i.e., (1) through (7)) are completely finished in advance, the time required for calculating the applied pressure P can be significantly reduced.

Accordingly, the fourth embodiment makes it possible to reduce the electric power consumption required for the calculations. This is especially useful when the circuit system is driven by a battery. Furthermore, the fourth embodiment reduces the cost of the system because there is no necessity of modifying the hardware arrangement, such as an arrangement for increasing the clock frequency for the computation programs.

Moreover, according to the fourth embodiment, the pressure information D responsive to the sensor signal Sd can be adequately corrected by the temperature information T responsive to the temperature signal St and the reference information A responsive to the reference signal Sa. As a result, it becomes possible to accurately detect the pressure value.

The above-described fourth embodiment uses the A/D conversion circuit 9 including the ring-gate delay circuit 10. The conversion speed is greatly increased, and therefore the sampling time can be greatly reduced. As a result, the sensed pressure value can be promptly calculated within a short time.

Furthermore, the differential amplification circuit 8 can be replaced by an impedance conversion circuit.

Various Modifications

The sensing apparatus of the present invention is not limited to a semiconductor pressure sensing apparatus. For example, the present invention can be applied to a sensing apparatus for detecting other physical quantities including acceleration, magnetic flux, and humidity. It is possible to modify the circuit arrangement of the ring-gate delay circuit 10 in the A/D conversion circuit 9.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A sensing apparatus comprising:
    a sensing circuit for generating a sensor signal having a voltage level responsive to a detected physical quantity;
    a temperature detecting circuit for generating a temperature signal having a voltage level responsive to a temperature of said sensing circuit;
    a reference voltage generating circuit for generating a reference signal having a constant voltage level irrespective of said detected physical quantity and the temperature of said sensing circuit;
    an analog multiplexer which receives each of said sensor signal, said temperature signal, and said reference signal and which selectively, successively outputs said sensor signal, said temperature signal, and said reference signal;
    amplification means which successively receives said sensor signal, said temperature signal, and said reference signal from said analog multiplexer and which amplifies said sensor signal, said temperature signal, and said reference signal to produce an amplified voltage signal;
    an A/D conversion circuit which receives the amplified voltage signal as a power source voltage and which converts said amplified voltage signal into digital data as an A/D conversion value during a predetermined time; and
    signal processing means for performing calculations based on said digital data in such a manner that the sensor signal corresponding to the detected physical quantity is corrected with respect to the temperature signal and with respect to said reference signal.

2. The sensing apparatus in accordance with claim 1, wherein said physical quantity to be detected by said sensing circuit is pressure.

3. The sensing apparatus in accordance with claim 1, further comprising:
    a power source circuit which is operative to supply a constant voltage to said sensing circuit, said temperature detecting circuit, said reference voltage generating circuit, said analog multiplexer, and said amplification means, and
    control means for stopping an operation of said power source circuit when said A/D converting circuit has completed the operation for converting said sensor signal, said temperature signal, and said reference signal into digital data.

4. The sensing apparatus in accordance with claim 1, further comprising a constant voltage power source for maintaining the amplified signal of said amplification means at a predetermined voltage level.

5. A sensing apparatus comprising:
    a sensing circuit for generating a sensor signal having a voltage level responsive to a detected physical quantity;
    a temperature detecting circuit for generating a temperature signal having a voltage level responsive to a temperature of said sensing circuit;
    a reference voltage generating circuit for generating a reference signal having a constant voltage level irrespective of said detected physical quantity and the temperature of said sensing circuit;
    an analog multiplexer which receives each of said sensor signal, said temperature signal, and said reference signal and which selectively, successively outputs said sensor signal, said temperature signal, and said sensing signal;
    amplification means which successively receives said sensor signal, said temperature signal, and said reference signal from said analog multiplexer and which amplifies said sensor signal, said temperature signal, and said reference signal to produce an amplified voltage;
    an A/D conversion circuit which receives the amplified voltage signal as a power source voltage and which converts said amplified voltage signal into digital data as an A/D conversion value during a predetermined time; and
    signal processing means for performing calculations based on said digital data in such a manner that the sensor signal corresponding to the detected physical quantity is corrected with respect to the temperature signal and with respect to said reference signal;
    wherein said A/D converting circuit includes a ring-gate delay circuit comprising a plurality of inverting circuits connected in a ring pattern and having an inverting operation time varying in accordance with said power source voltage, and each of said sensor signal, said temperature signal, and said reference signal, when serving as said power source voltage of said ring-gate delay circuit, is converted into digital data based on a pulse signal circulation frequency when a pulse signal is entered into said ring-gate delay circuit.

6. A sensing apparatus comprising:

a sensing circuit for generating a sensor signal having a voltage level responsive to a detected physical quantity;

a temperature detecting circuit for generating a temperature signal having a voltage level responsive to a temperature of said sensing circuit;

a reference voltage generating circuit for generating a reference signal having a constant voltage level irrespective of said detected physical quantity and the temperature of said sensing circuit;

an analog multiplexer which receives each of said sensor signal, said temperature signal, and said reference signal and which selectively, successively outputs said sensor signal, said temperature signal, and said sensing signal;

amplification means which successively receives said sensor signal, said temperature signal, and said reference signal from said analog multiplexer and which amplifies said sensor signal, said temperature signal, and said reference signal to produce an amplified voltage;

an A/D conversion circuit which receives the amplified voltage signal as a power source voltage and which converts said amplified voltage signal into digital data as an A/D conversion value during a predetermined time; and signal processing means for performing calculations based on said digital data in such a manner that the sensor signal corresponding to the detected physical quantity is corrected with respect to the temperature signal and with respect to said reference signal;

wherein said physical quantity to be detected by said sensing circuit is pressure;

wherein said signal processing means is for calculating a pressure P applied to said sensing circuit according to the following equation $$P=\{(T/A-b)*(-e/a)+D/A-f\}/\{(T/A-b)*c/a+d\}$$

where D, T and A are digital data respectively representing pressure information, temperature information and reference information converted by said A/D converting circuit, "c" represents a temperature coefficient in the sensitivity of the sensing circuit, "d" represents a room temperature sensitivity of the sensing circuit, "e" represents a temperature coefficient of an offset of a detected pressure value, "f" represents a room temperature offset value of the detected pressure value, "a" represents a temperature coefficient of a detected temperature value, and "b" represents a room temperature offset value of the detected temperature value.

7. A sensing apparatus comprising:

a sensing circuit for generating a sensor signal having a voltage level responsive to a detected physical quantity;

a temperature detecting circuit for generating a temperature signal having a voltage level responsive to a temperature of said sensing circuit;

a reference voltage generating circuit for generating a reference signal having a constant voltage level irrespective of said detected physical quantity and the temperature of said sensing circuit;

an A/D conversion circuit including a ring-gate delay circuit comprising a plurality of inverting circuits connected in a ring pattern and having an inverting operation time varying in accordance with said power source voltage, for converting each of said sensor signal, said temperature signal, and said reference signal, when serving as a power source voltage of said ring-gate delay circuit, into binary data based on a pulse signal circulation frequency when a pulse signal is entered into said ring-gate delay circuit;

signal processing means for performing calculations based on said digital data in such a manner that the physical quantity corresponding to said sensor signal is corrected with reference to the temperature signal and said reference signal; and compensating means for compensating said power source voltage applied to said ring-gate delay circuit in said A/D conversion circuit, said compensating means including memory means for storing correction voltage data corresponding to offset amounts of said sensor signal, said temperature signal, and said reference signal under same conditions, wherein the power source voltage applied to said ring-gate delay circuit is corrected in accordance with said correction data when said sensor signal, said temperature signal, and said reference signal are selectively applied to said A/D conversion circuit as said power source voltage.

8. The sensing apparatus in accordance with claim 7, further comprising amplification means for amplifying said sensor signal, said temperature signal, and said reference signal and applies an amplified signal to said ring-gate delay circuit in said A/D conversion circuit.

9. The sensing apparatus in accordance with claim 8, wherein an amplification rate of said amplification means is determined in such a manner that said amplified signal of said amplification means contains a nonlinear error component equal to or less than 0.1%.

10. The sensing apparatus in accordance with claim 8, wherein an amplification rate of said amplification means is determined in such a manner that a difference between a maximum voltage level and a minimum voltage level of said amplified signal of said amplification means is equal to or less than 150 mV.

11. The sensing apparatus in accordance with claim 8, further comprising an analog multiplexer for selectively outputting said sensor signal, said temperature signal, and said reference signal, wherein said amplification means is for amplifying an output signal selected by said analog multiplexer and applying the amplified signal as the power source voltage to said ring-gate delay circuit in said A/D conversion circuit.

12. The sensing apparatus in accordance with claim 7, wherein said A/D conversion circuit has a sampling period equal to or larger than 50 $\mu$sec.

13. The sensing apparatus in accordance with claim 7, wherein said memory means stores said correction voltage data in a quantized condition, and said compensating means further comprises a selector for selectively outputting the correction voltage data from said memory means and a D/A conversion circuit for converting the selected correction voltage data into an analog voltage signal.

14. The sensing apparatus in accordance with claim 7, wherein said physical quantity to be detected by said sensing circuit is pressure.

15. The sensing apparatus in accordance with claim 14, wherein said sensing circuit includes a plurality of diffused resistance elements formed on a diaphragm of a semiconductor chip and arranged in a bridge connection pattern, and said temperature detecting circuit includes at least one temperature-sensitive diffused resistance element formed on said semiconductor chip.

16. The sensing apparatus in accordance with claim 14, wherein said signal processing means is for calculating a pressure P applied to said sensing circuit according to the following equation $$P=\{(T/A-b)\times(-e/a)+D/A-f\}/\{(T/A-b)\times c/a+d\}$$

where D, T and A are digital data respectively representing pressure information, temperature information, and reference information converted by said A/D converting circuit, "c" represents a temperature coefficient in the sensitivity of the sensing circuit, "d" represents a room temperature sensitivity of the sensing circuit, "e" represents a temperature coefficient of an offset of a detected pressure value, "f" represents a room temperature offset value of the detected pressure value, "a" represents a temperature coefficient of a detected temperature value, and "b" represents a room temperature offset value of the detected temperature value.

17. A sensing apparatus comprising:

a pressure sensing circuit for generating a sensor signal having a voltage level responsive to a detected pressure;

a temperature detecting circuit for generating a temperature signal having a voltage level responsive to a temperature of said pressure sensing circuit;

a reference voltage generating circuit for generating a reference signal having a constant voltage level irrespective of said detected pressure and the temperature of said pressure sensing circuit;

an analog multiplexer for selectively outputting said sensor signal, said temperature signal, and said reference signal;

an A/D conversion circuit for converting said sensor signal, said temperature signal, and said reference signal into digital data; and signal processing means for calculating a pressure P applied to said pressure sensing circuit according to the following equation $$P=\{(T/A-b)\times(-e/a)+D/A-f\}/\{(T/A-b)\times c/a+d\}$$

where D, T and A are digital data respectively representing pressure information, temperature information, and reference information converted by said A/D converting circuit, "c" represents a temperature coefficient in the sensitivity of the pressure sensing circuit, "d" represents a room temperature sensitivity of the pressure sensing circuit, "e" represents a temperature coefficient of an offset of a detected pressure value, "f" represents a room temperature offset value of the detected pressure value, "a" represents a temperature coefficient of a detected temperature value, and "b" represents a room temperature offset value of the detected temperature value, wherein said analog multiplexer outputs said reference signal and said temperature signal prior to said sensor signal, and said signal processing means is for performing calculation steps relating to said reference information A and said temperature information T corresponding to said reference signal and said temperature signal in advance and at a later timing for performing calculation steps relating to said pressure information D corresponding to the sensor signal.

18. The sensing apparatus in accordance with claim 17, wherein said analog multiplexer successively outputs said reference signal, said temperature signal, and said sensor signal in this order, and said signal processing means is for successively performing first, second, and third calculation steps in this order, wherein said first calculation step is for performing the calculation based on said reference information A, said second calculation step is for performing the calculation based on said temperature information T and the calculation result of said first calculation step, and said third calculation step is for performing the calculation based on said pressure information D and the calculation result of said second calculation step.

19. The sensing apparatus in accordance with claim 17, wherein said A/D converting circuit includes a ring-gate delay circuit comprising a plurality of inverting circuits connected in a ring pattern and having an inverting operation time varying in accordance with a power source voltage, and each of said sensor signal, said temperature signal, and said reference signal, when serving as said power source voltage of said ring-gate delay circuit, is converted into digital data based on a pulse signal circulation frequency when a pulse signal is entered into said ring-gate delay circuit.

* * * * *